United States Patent
Swaminathan et al.

(10) Patent No.: US 10,541,117 B2
(45) Date of Patent: Jan. 21, 2020

(54) SYSTEMS AND METHODS FOR TILTING A WAFER FOR ACHIEVING DEPOSITION UNIFORMITY

(71) Applicant: Lam Research Corporation, Fremont, CA (US)

(72) Inventors: Shankar Swaminathan, Beaverton, OR (US); Pramod Subramonium, Portland, OR (US); Frank L. Pasquale, Beaverton, OR (US); Jeongseok Ha, Portland, OR (US); Chloe Baldasseroni, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 745 days.

(21) Appl. No.: 14/937,174

(22) Filed: Nov. 10, 2015

(65) Prior Publication Data
US 2017/0121819 A1    May 4, 2017

Related U.S. Application Data

(60) Provisional application No. 62/248,230, filed on Oct. 29, 2015.

(51) Int. Cl.
*C23C 16/458* (2006.01)
*H01L 21/687* (2006.01)
*H01J 37/32* (2006.01)

(52) U.S. Cl.
CPC .... *H01J 37/32715* (2013.01); *C23C 16/4585* (2013.01); *H01J 37/32733* (2013.01); *C23C 16/458* (2013.01); *H01J 2237/20207* (2013.01); *H01L 21/68785* (2013.01)

(58) Field of Classification Search
CPC .............. C23C 16/4585; C23C 16/458; H01J 2237/20207; H01J 37/32715; H01J 37/32733; H01L 21/68764
See application file for complete search history.

(56) References Cited

U.S. PATENT DOCUMENTS

| | | | | |
|---|---|---|---|---|
| 3,630,804 A | * | 12/1971 | Coffman | C23F 1/08 134/153 |
| 4,238,312 A | | 12/1980 | Galicki et al. | |
| 6,044,534 A | * | 4/2000 | Seo | H01L 21/68707 29/25.01 |

(Continued)

OTHER PUBLICATIONS

Wang et al., Misorientation dependent epilayer tilting and stress distribution in heteroepitaxially grown silicon carbide on silicon (111) substrate, available at http://www98.grithth.edu.au/dspace/handle/10072/61994?show=full; Thin Solid Films; 2014; Elsevier; Switzerland.

(Continued)

*Primary Examiner* — Aiden Lee
(74) *Attorney, Agent, or Firm* — Penilla IP, APC

(57) ABSTRACT

Heights of carrier ring supports are increased at a side of a wafer that is located closer to a spindle of a plasma chamber. The heights are increased relative to a height of a carrier ring support that is located closer to side walls of the plasma chamber. The increase in the height results in an increase in thickness of a thin film deposited on the wafer to further achieve uniformity in thickness of the thin film across a top surface of the wafer.

18 Claims, 20 Drawing Sheets

(56) References Cited

U.S. PATENT DOCUMENTS

| | | | | |
|---|---|---|---|---|
| 6,305,677 B1* | 10/2001 | Lenz | | H01L 21/6831 269/13 |
| 6,776,849 B2* | 8/2004 | Aggarwal | | C23C 16/4584 118/500 |
| 6,860,965 B1* | 3/2005 | Stevens | | C23C 14/566 118/719 |
| 7,751,172 B2* | 7/2010 | Purohit | | H01L 21/6831 361/234 |
| 8,361,233 B2* | 1/2013 | Kwon | | B65G 49/065 118/500 |
| 2002/0044864 A1* | 4/2002 | Hyakudomi | | H01L 21/682 414/784 |
| 2004/0149389 A1* | 8/2004 | Fink | | H01J 37/32642 156/345.51 |
| 2005/0087939 A1* | 4/2005 | Caldwell | | H01L 21/67288 279/128 |
| 2007/0128888 A1* | 6/2007 | Goto | | H01L 21/6838 438/795 |
| 2009/0000552 A1* | 1/2009 | Sohda | | C23C 14/50 118/728 |
| 2010/0248490 A1* | 9/2010 | McMillin | | H01J 37/32788 438/716 |
| 2011/0108895 A1* | 5/2011 | Cheng | | H01J 37/32733 257/288 |
| 2014/0235072 A1* | 8/2014 | Ito | | H01L 21/67115 438/795 |
| 2017/0263483 A1* | 9/2017 | Kuwahara | | H01L 21/67259 |
| 2018/0090364 A1* | 3/2018 | Moriyama | | C23C 16/4584 |

OTHER PUBLICATIONS

"Chemical Vapor Deposition", available at http://users.wfu.edu/ucerkb/Nan242/L09-CVD_a.pdf, Wake Forest University.

"Chemical Vapor Deposition (cont.)", available at http://users.wfu.edu/ucerkb/Nan242/L10-CVD_b.pdf, Wake Forest University.

Magnetron Sputtering Systems-PVD Products, available at http://www.pvdproducts.com/sputtering-systems/magnetron-sputtering-systems, Copyright 2016, PVD Products, Inc.

* cited by examiner

SYSTEMS AND METHODS FOR TILTING A WAFER FOR ACHIEVING DEPOSITION UNIFORMITY

CLAIM OF PRIORITY

This application claims the benefit of and priority, under 35 U.S.C. 119 § (e), to U.S. Provisional Patent Application No. 62/248,230, filed on Oct. 29, 2015, and titled "SYSTEMS AND METHODS FOR TILTING A WAFER FOR ACHIEVING DEPOSITION UNIFORMITY", which is hereby incorporated by reference in its entirety.

FIELD

The present embodiments relate to systems and methods for tilting a wafer for achieving deposition uniformity.

BACKGROUND

The fabrication of integrated circuits includes many diverse processing steps. One of the operations frequently employed is the deposition of a dielectric film into a gap between features patterned over or into a silicon substrate. One method of depositing such a film is through plasma enhanced atomic layer deposition (PEALD). In this type of method, several operations are undertaken in a cyclic manner to deposit a conformal film. Typically, PEALD processes include the steps of (a) providing a dose of a first reactant to a reaction chamber, (b) igniting plasma in the reaction chamber (c) purging the reaction chamber, (c) providing a flow of a second reactant, (d) igniting plasma in the reaction chamber, and (e) extinguishing the plasma and purging the reaction chamber. A single cycle of a PEALD process deposits a monolayer of material. In PEALD, any number of reactants is deposited and any number of purging operations takes place to reach a desired film thickness.

A large number of PEALD processes result in deposition of the dielectric film that has a non-uniform thickness across a surface of silicon substrate. It is in this context that embodiments described in the present disclosure arise.

SUMMARY

Embodiments of the disclosure provide apparatus, methods and computer programs for tilting a wafer for achieving deposition uniformity. It should be appreciated that the present embodiments can be implemented in numerous ways, e.g., a process, an apparatus, a system, a device, or a method on a computer-readable medium. Several embodiments are described below.

In several embodiments, heights of carrier ring supports that are located towards a spindle are increased compared to a height of a carrier ring support located closer to side walls of a plasma chamber. The plasma chamber includes the spindle surrounded by four stations having four pedestals on which wafers are supported for processing.

In some embodiments, a plasma chamber is described. The plasma chamber includes a plurality of side walls, a spindle, and a plurality of pedestals. The pedestals are enclosed by the side walls. Moreover, the pedestals are arranged around the spindle so that the spindle is located between the pedestals. The plasma chamber includes a plurality of carrier ring supports located at a periphery of one of the pedestals for supporting a carrier ring. The carrier ring is used to lift a substrate when present in the chamber to move the substrate from one of the pedestals to another one of the pedestals. A first one of the carrier ring supports is closer to the spindle compared to a corner between two of the side walls. A second one of the carrier ring supports is closer to the corner compared to the spindle. The first carrier ring support is raised with respect to the second carrier ring support to tilt the substrate when present to allow a higher amount of deposition on a side of the substrate closer to the spindle than an amount of deposition on a side of the substrate closer to the corner to further increase uniformity in a thickness of a film deposited on the substrate when present.

In some embodiments, a height of a minimal contact angle (MCA) support is increased to increase a height of a wafer at the spindle side of the plasma chamber. The height of the MCA support is increased compared to heights of MCA supports located towards the side walls of the chamber.

In various embodiments, a plasma chamber includes a plurality of side walls, a spindle, and a plurality of pedestals. The pedestals are enclosed by the side walls. Also, the pedestals are arranged around the spindle so that the spindle is located between the pedestals. The plasma chamber includes a plurality of minimum contact angle (MCA) supports located on a top surface of one of the pedestals for supporting a substrate when present during processing of the substrate. A first one of the MCA supports is closer to the spindle compared to two of the side walls. A second one of the MCA supports is closer to the two side walls compared to the spindle. The first MCA support is raised with respect to the second MCA support to tilt the substrate when present to allow a higher amount of deposition on a side of the substrate closer to the spindle than an amount of deposition on a side of the substrate closer to the two side walls to further increase uniformity in a thickness of a film deposited on the substrate when present.

In various embodiments, heights of the MCA support and of the carrier ring supports are increased simultaneously.

In some embodiments, a height of the MCA support and/or heights of the carrier ring supports are accurately controlled, e.g., in an order of mils, etc., to control deposition on a substrate in an order of Angstroms.

Some advantages of the herein described systems and methods include increasing uniformity in deposition of a thin film on a substrate. During substrate processing, the increase in the height of the MCA support and/or of the heights of the carrier ring supports elevates an end of the substrate located closer to the spindle compared an end of the wafer located closer to the side walls. The elevation of the end of the substrate reduces a distance between a showerhead of the chamber and the end to increase an amount of deposition on the end of the substrate to further achieving uniformity in a thickness of a film deposited on the substrate.

Additional advantages include controlling a height of the MCA support and/or heights of the carrier ring supports in an order of mils to increase an amount of deposition on a side of the wafer by an order of Angstroms. Such orders allow for precise control in an amount of deposition of a thin film on the wafer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1:
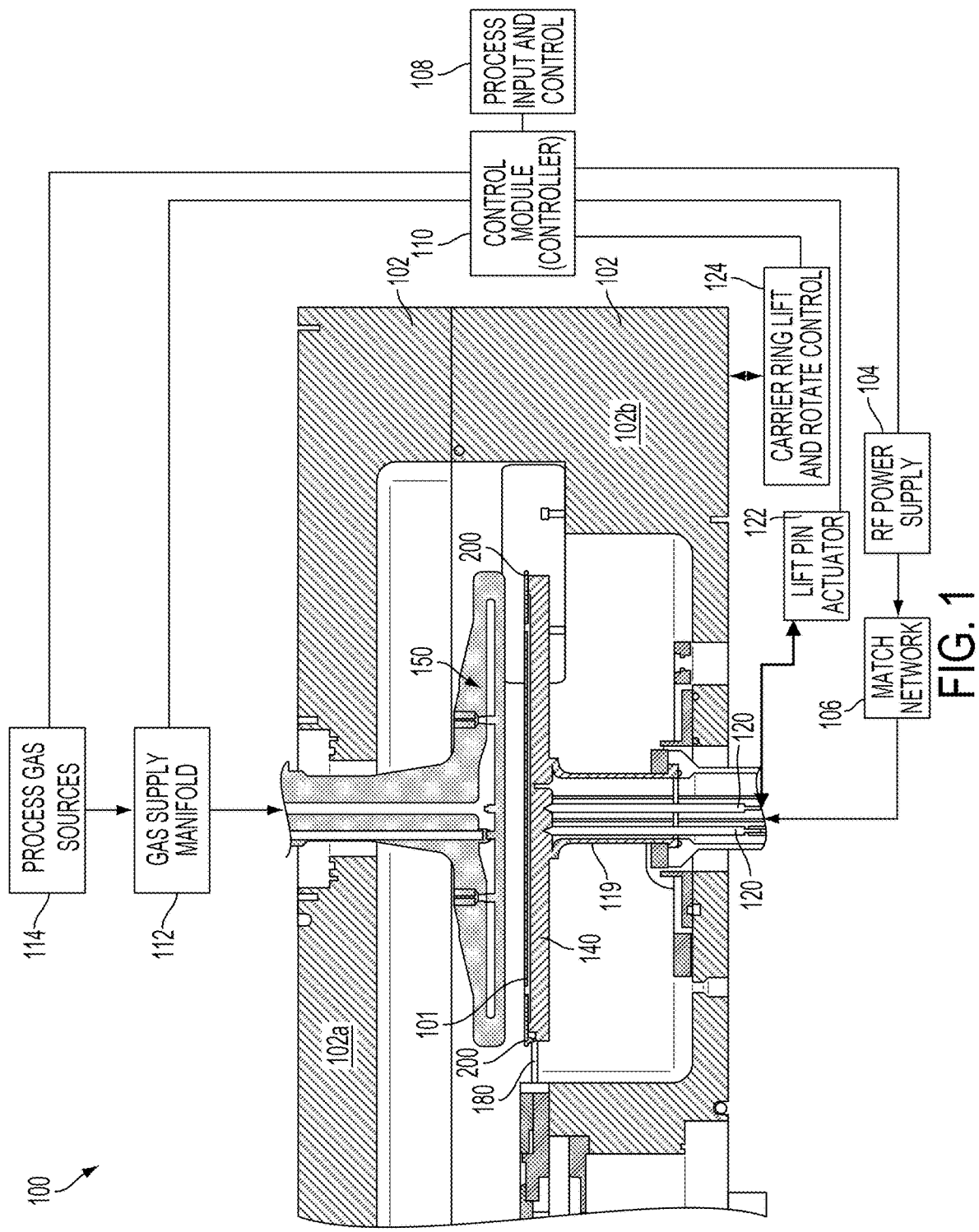
FIG. 1 illustrates a substrate processing system used to process a wafer, in accordance with some embodiments described in the present disclosure.

The following embodiments describe systems and methods for tilting a substrate to compensate for non-uniformities in azimuthal deposition. It will be apparent that the present embodiments may be practiced without some or all of these specific details. In other instances, well known process operations have not been described in detail in order not to unnecessarily obscure the present embodiments.

Deposition of films is preferably implemented in an atomic layer deposition (ALD) system. The ALD system may take many different forms. The ALD system includes one or more chambers or "reactors" (sometimes including multiple stations) that house one or more substrates, e.g., wafers, etc., and are suitable for substrate processing. For example, a multi-station chamber includes four stations, and the four stations are arranged in a square configuration with a rotating mechanism, e.g., a spindle, etc., in a center location. The four stations are surrounded by chamber walls. Each station may house one or more substrates for processing. The one or more stations maintain substrates in a defined position or positions. A wafer undergoing deposition is transferred from one station to another within a reactor chamber during the process. Of course, the ALD deposition may occur entirely at a single station or any fraction of the film may be deposited at any number of stations.

While in process, each wafer is held in place by a pedestal, e.g., a wafer chuck, etc., and/or other wafer holding apparatus. A pedestal for supporting a wafer is provided for each of the four stations, each pedestal is disposed in a lower chamber body, and a carrier ring is overlaid on a periphery of each pedestal. For example, a carrier ring is disposed around respective pedestals of each of the stations. The carrier ring is made of a dielectric material, e.g., ceramic, etc. In this configuration, a spider fork, one for each station, simultaneously lifts a corresponding carrier ring for that station (and any wafer disposed thereon), and rotates the carrier ring and wafer to the next station (e.g., for additional or different processing). Each spider fork rotates when the spindle, which is located at a center of the square in which the four stations are arranged, rotates.

In some embodiments, the carrier ring may be referred to as a plasma focus ring. In such embodiments, the plasma focus ring functions to focus or optimize plasma processing across a surface of a substrate, including edges of the substrate. Generally speaking a plasma focus ring works to extend a peripheral surface of an edge of the substrate so that non-uniformities due to the substrate edge are extended to an outer surface edge of the plasma focus ring (i.e., instead of the substrate edge).

An ALD dielectric film, e.g., a silicon dioxide film, a silicon nitride film, a phosphosilicate glass film, a silicon oxide film, etc., deposited on the substrate has an azimuthal tilt created by varying levels of thickness. For example, the dielectric film is thinner towards the spindle and is thicker towards a corner formed between two adjacent walls of a chamber. The azimuthal tilt is correlated to several different factors ranging from thermal differences to plasma impedance changes.

In various embodiments, a method for tilting a plane of the substrate with respect to a frame of reference is provided to improve uniformity in thickness of ALD dielectric films to counteract the azimuthal tilt in a thin film. The frame of reference can be either the pedestal mesa, e.g., a horizontal plane of the pedestal, etc., or a horizontal plane of the carrier ring. In some embodiments, such a tilt of the plane of the substrate primarily leads to modulation of temperature of a local surface of the substrate under normal processing conditions, and leads to change in local plasma coupling to improve uniformity in deposition of a dielectric film on the substrate.

In some embodiments, the substrate is tilted either by shimming the carrier ring in an upward vertical direction on one side of the pedestal and/or by raising height of a minimum contact angle (MCA) support on which the substrate rests.

In some embodiments, a height of a carrier ring that supports a substrate at an azimuthal region, of the substrate, towards the spindle is increased compared to a height of the carrier ring that supports the substrate at an azimuthal region, of the substrate, towards the chamber walls to increase an amount of thickness of a film deposited on the azimuthal region, of the substrate, towards the spindle. For example, a height of a carrier ring support that supports the substrate at the azimuthal region, of the substrate, towards the spindle is increased compared to height of another carrier ring support that supports the substrate at the azimuthal region, of the substrate, towards the chamber walls.

The thickness of the film is increased to provide uniform thickness of the film along a radial region of the substrate. An example of an azimuthal region of a substrate is a region that is located at a periphery of the substrate at a fixed radius from a center of the substrate. An example of a radial region of a substrate is a region located along a radius of the substrate.

In various embodiments, a number of MCA supports are provided on each pedestal. For example, an MCA support is fitted, e.g., with a screw or a bolt or adhesive or another attachment mechanism, etc., to a pedestal. The MCA supports are provided to achieve a level of a substrate so that the substrate is uniformly processed, e.g., a film is uniformly deposited on a top surface of a substrate, etc. Height of an MCA support that is located towards the spindle is increased compared to height of an MCA support that is located away from the spindle, e.g., towards the chamber walls, etc., to increase an amount of thickness of a film deposited on an azimuthal region, of a substrate, towards the spindle.

In some embodiments, a method to compensate for azimuthal thickness tilts in film at an Angstrom level is described. The method allows for accurate control or compensation of azimuthal thickness tilts in film in a range of 0.5 Angstrom to 5 Angstroms, e.g., 0.87 Angstrom, 0.90 Angstrom, 1 Angstrom, 2 Angstroms, etc, for each cycle of deposition of the film on a substrate.

In various embodiments, the substrate is tilted and the tilt is supported with respect to the frame of reference using shims to mount the carrier ring on one side while simultaneously ensuring that a deposition of a thin film on a backside of the substrate is mitigated. While the substrate is tilted, deposition does not occur or minimal deposition occurs on a backside of the substrate. ALD dielectric films can wrap around a bevel of the substrate causing backside deposition that leads to integration problems. When a height of the carrier ring towards the spindle is increased, a minimal contact between the carrier ring support and the carrier ring reduces any backside deposition under the substrate. Moreover, in some embodiments, a height of one or more MCA supports is increased to reduce the backside deposition. The greater the number of MCA supports contacting the backside of the substrate, the lesser the amount of deposition on the backside of the substrate.

In some embodiments, substrate deflection differences across the pedestal, sometimes referred to herein as potato chipping, are managed by changing heights of some MCA supports that are not used to tilt the substrate.

FIG. 1 illustrates a substrate processing system 100, which is used to process a wafer 101. The system includes a chamber 102 having a lower chamber portion 102b and an upper chamber portion 102a. A center column 119 of a radio frequency (RF) transmission line is configured to support a pedestal 140, which in one embodiment includes a powered lower electrode. The pedestal 140 is electrically coupled to a radio frequency (RF) power supply 104 via a match network 106 and the RF transmission line. The power supply is controlled by a control module 110, e.g., a controller, etc. It should be noted that a controller, as used herein, includes a processor and a memory device. Examples of the processor include a microprocessor, an application specific integrated circuit (ASIC), a programmable logic device (PLD), and a central processing unit (CPU). The control module 110 operates the substrate processing system 100 by executing process input and control 108, which is stored in the memory device. Examples of the memory device include a read-only memory (ROM), a random access memory (RAM), a flash memory, a storage disk array, a hard disk, etc. The process input and control 108 may include process recipes, such as power levels, timing parameters, process gasses, mechanical movement of the wafer 101, etc., so as to deposit or form films over the wafer 101.

The center column 119 is also shown to include lift pins 120, which are controlled by lift pin actuator 122, e.g., a motor, etc. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gas sources 114, e.g., storage of gas chemistry supplies. Depending on the processing being performed, the control module 110 controls the delivery of process gases via the gas supply manifold 112. The chosen gases are then flown into a shower head 150 and distributed in a space volume defined between a surface of the showerhead 150 that faces that wafer 101 and the wafer 101 resting over the pedestal 140.

Further, the process gases are premixed or not. Appropriate valving and mass flow control mechanisms are employed to ensure that the correct gases are delivered during the deposition and plasma treatment phases during processing of the wafer 101. Process gases exit the chamber 102 via an outlet. A vacuum pump (e.g., a one or two stage mechanical dry pump and/or a turbomolecular pump, etc.) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 sits over multiple carrier ring supports that are located one or more steps down from a wafer support region in a center of the pedestal 140. The carrier ring 200 includes an outer edge side of its disk structure, e.g., outer radius, and a wafer edge side of its disk structure, e.g., inner radius, that is closest to where the wafer 101 sits. Towards the wafer edge side of the carrier ring are the pins 120, which are structures that lift the wafer 101 when the carrier ring 200 is lifted by spider forks 180. The carrier ring 200 is therefore lifted along with the wafer 101 and can be rotated to another station, e.g., in a multi-station chamber, etc.

In an embodiment, an upper electrode within the showerhead 150 is grounded when RF power is supplied from the RF power supply 104 to the lower electrode within the pedestal 140.

In one embodiment, instead of the pedestal 140 being electrically coupled to the RF power supply 104 via the match network 106, the upper electrode within the showerhead 150 is coupled to the RF power supply 104 via a match network for receiving power from the RF power supply 104 and the lower electrode within the pedestal 140 is grounded.

In one embodiment, instead of the RF power supply 104, multiple RF power supplies generating RF signals having different frequencies are used, e.g., a power supply for generating an RF signal having a frequency RF1 and a power supply for generating an RF signal having a frequency RF2.

Figure 2:
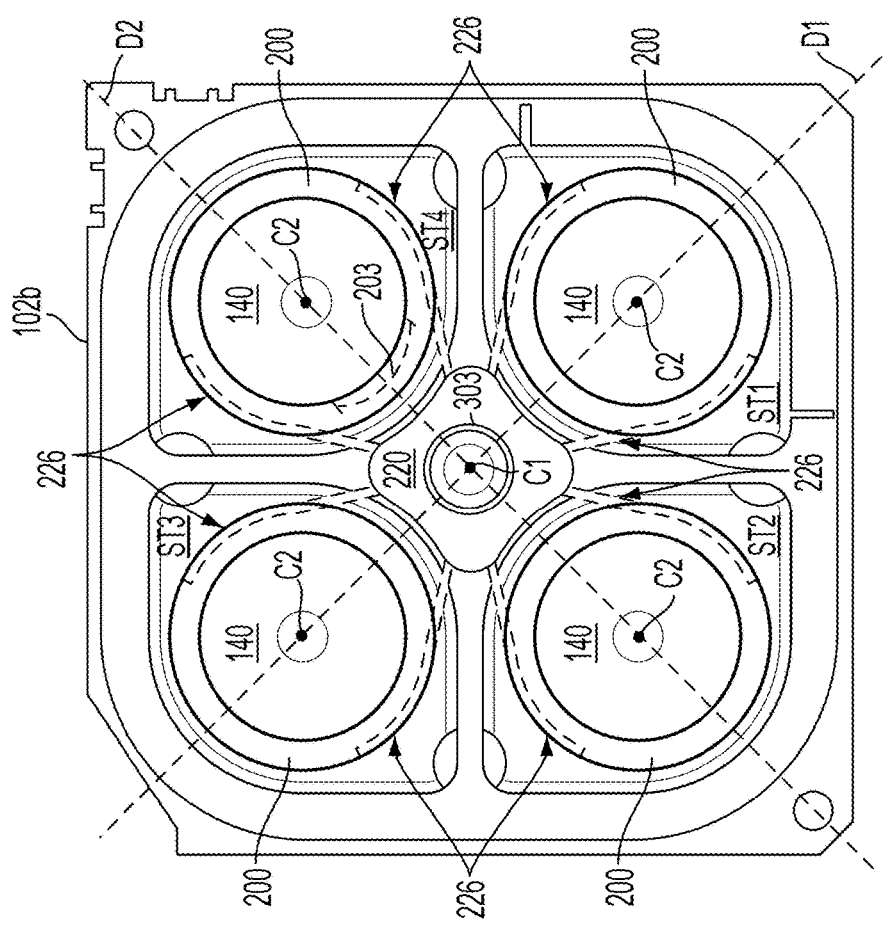
FIG. 2 illustrates a top view of a multi-station processing chamber in which four processing stations are provided, in accordance with various embodiments described in the present disclosure.

FIG. 2 illustrates a top view of a multi-station processing chamber in which four processing stations ST1, ST2, ST3, and ST4 are provided. This top view is of the lower chamber portion 102b (e.g., with the top chamber portion 102a removed for illustration), where four stations are accessed by spider forks 226. In one embodiment, there is no isolation wall or other mechanism to isolate one station from another. Each spider fork includes a first and second arm, each of which is positioned around a portion of each side of the carrier ring 200. In this view, the spider forks 226 are drawn in dash-lines, to convey that they are below the carrier ring 200. The spider forks 226, using an engagement and rotation mechanism 220, raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers, such as the wafer 101, etc.

A side 203 of the pedestal 140 of the station ST4 is adjacent to a spindle 303 of the rotating mechanism 220 and also adjacent to the engagement and rotation mechanism 220. In some embodiments, the engagement and rotation mechanism 220 includes a motor, the spindle 303, and a shaft that connects the spindle 303 to the motor, etc. The side 203 extends a pre-determined distance, along a circumference of the pedestal 140, from a diagonal axis D2 and faces the rotating mechanism 220 and the spindle 303. For example, the side 203 extends from the diagonal axis D2 equally along an arc on either side of the diagonal axis D2 until less than half of an area of the pedestal 140 is reached. The diagonal axis D2 passes through a center C1 of the spindle 303 and a center C2 of the pedestal 140 of each of the stations ST2 and ST4. FIG. 2 also shows a diagonal axis D1, which passes through the center C1 of the spindle 303 and a center C2 of the pedestal 140 of each of the stations ST1 and ST3.

Figure 3:
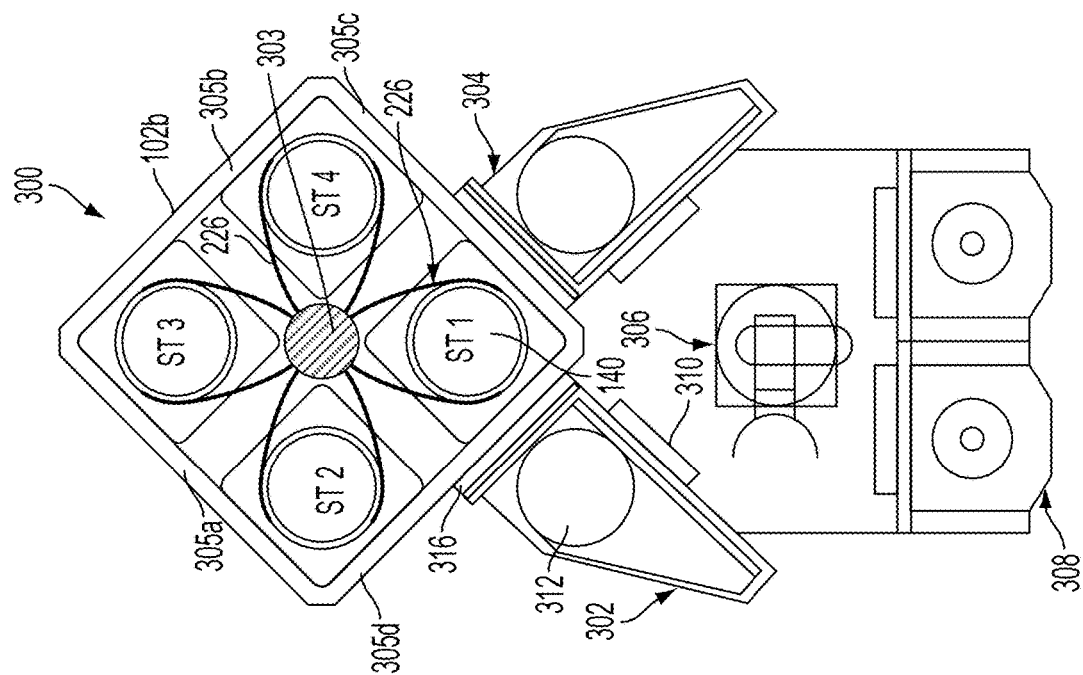
FIG. 3 shows a schematic view of a multi-station processing tool with an inbound load lock and an outbound load lock, in accordance with various embodiments described in the present disclosure.

FIG. 3 shows a schematic view of an embodiment of a multi-station processing tool 300 with an inbound load lock 302 and an outbound load lock 304. A robot 306, at atmospheric pressure, moves substrates from a cassette loaded through a pod 308 into the inbound load lock 302 via an atmospheric port 310. The inbound load lock 302 is coupled to a vacuum source (not shown) so that, when atmospheric port 310 is closed, the inbound load lock 302 is pumped to generate a vacuum. The inbound load lock 302 also includes a chamber transport port 316 interfaced with the lower chamber portion 102b. Thus, when the chamber transport 316 is open, another robot (not shown) may move the substrate from inbound load lock 302 to the pedestal 140 of a process station for processing.

The lower chamber portion 102b includes four process stations, numbered ST 1 to ST 4 in the embodiment shown in FIG. 3. The four processing stations are located within and surrounded by side walls 305a, 305b, 305c, and 305d. In some embodiments, the lower chamber portion 102b maintains a low pressure environment so that wafers are transferred using the carrier ring 200 among the process stations without experiencing a vacuum break and/or air exposure. Each process station depicted in FIG. 3 includes the pedestal 140 and process gas delivery line inlets.

FIG. 3 also depicts spider forks 226 for transferring wafers within the lower chamber portion 102b. As will be described in more detail below, the spider forks 226 rotate and enable transfer of wafers from one station to another. The spider forks 226 rotate about the spindle 303 that is stationary to transfer wafers from one station to another. The transfer occurs by enabling the spider forks 226 to lift corresponding carrier rings from an outer undersurface, which lifts the wafer 101, and rotates the wafer 101 and the carrier ring 200 together to the next station. In one configuration, the spider forks 226 are made from a ceramic material to withstand high levels of heat during processing.

Figure 4A:
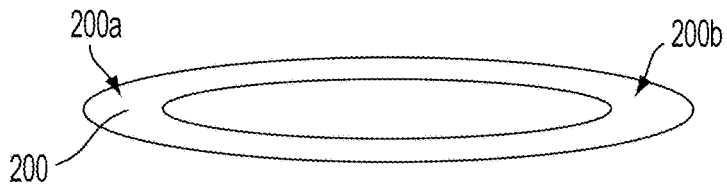
FIG. 4A is an isometric view of a carrier ring, in accordance with some embodiments described in the present disclosure.

FIG. 4A is an isometric view of an embodiment of the carrier ring 200. The carrier ring 200 has a side 200a and a side 200b. The side 200a is located diametrically opposite to the side 200b. For example, the side 200a is located closer to the spindle compared to the side 200b and the side 200b is located closer to the side walls of the lower chamber portion 102b compared to the side 200a.

Figure 4B:
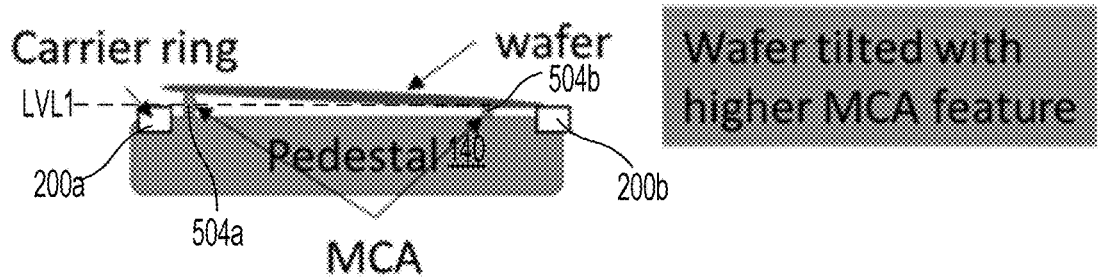
FIG. 4B is a side view to illustrate tilting of the wafer by using a minimum contact angle (MCA) support, in accordance with various embodiments described in the present disclosure.

FIG. 4B is a side view to illustrate tilting of a wafer, e.g., the wafer 101, etc., by using an MCA support. A number of MCAs, e.g., three MCA supports, six MCA supports, etc., are coupled to and rest on the pedestal 140. An example of an MCA support includes a pin made from a stone, e.g., sapphire, etc. An MCA is fitted, e.g. screwed, bolted, glued to, etc., to a slot fabricated within an upper surface of the pedestal 140. An MCA support 504a that is located closer to the spindle is of a greater height than a top surface level LVL1, which is a height of an MCA 504b located closer to walls of the lower chamber portion 102b. The MCA support 504a is located closer to the spindle compared to the MCA 504b and the MCA 504b is located closer to the side walls of the lower chamber portion 102b compared to the MCA support 504a. The MCA support 504a that is located closer to the spindle is of a greater height from a top surface level of the pedestal 140 compared to a height of the MCA 504b that is located closer to walls of the lower chamber portion 102b. The increase in the height of the MCA support 504a facilitates a higher amount of deposition on an azimuthal region, of the wafer, located towards the spindle, than an amount of deposition on an azimuthal region, of the wafer, located closer towards the side walls of the lower chamber portion 102b to achieve uniformity in deposition of atomic layers on a top surface of the wafer. The higher amount of deposition occurs when the azimuthal region, of the wafer, located closer to the spindle comes closer to the showerhead 150 compared to the azimuthal region, of the wafer, located closer to the side walls of the of the lower chamber portion 102b.

Figure 4C:
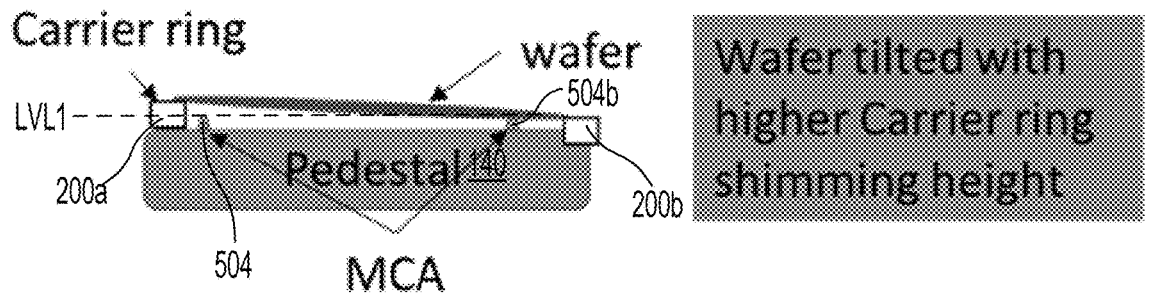
FIG. 4C is a side view to illustrate tilting of the wafer by using a carrier ring, in accordance with several embodiments described in the present disclosure.

FIG. 4C is a side view to illustrate tilting of a wafer, e.g., the wafer 101, etc., by using a carrier ring. Height of an MCA support 504 is not raised to tilt the wafer. The side 200a, of the carrier ring 200, that is located closer to the spindle compared the side 200b, of the carrier ring 200, located closer to the side walls of the lower chamber portion 102b is raised to increase a height of wafer at the azimuthal region located closer to the spindle. The side 200a is located closer to the spindle compared to the side 200b and the side 200b is located closer to the side walls of the lower chamber portion 102b compared to the side 200a. The height is increased compared to a higher of the wafer at the azimuthal region, of the wafer, located closer to the side walls of the lower chamber portion 102b. The height of the wafer at the azimuthal region, of the wafer, located closer to the side walls of the lower chamber portion 102b is lower than the height at the azimuthal region, of the wafer, located closer to the spindle when a height of the side 200b, of the carrier ring 200, located closer to the side walls of the lower chamber portion 102b is lower than a height of the side 200a, of the carrier ring 200, that is located closer to the spindle.

The higher height of the side 200a of the carrier ring 200 facilitates a higher amount of deposition on the azimuthal region, of the wafer, located closer to the spindle compared to the azimuthal region, of the wafer, located closer to the side walls of the lower chamber portion 102b to achieve uniformity in deposition of atomic layers on a top surface of the wafer. Moreover, a contact, e.g., a minimal contact, etc., between a top surface of the side 200a and the wafer reduces chances of process gases being deposited on a backside, e.g., a lower surface, etc., of the wafer. For example, process gases cannot enter or a minimal amount of process gases enter in a gap between a back surface of the wafer and a top surface of the pedestal.

In some embodiments, the wafer is tilted, e.g., at an angled position, etc., with respect to the level LVL1 by increasing height of the MCA support 504a and by increasing a height of the side 200a, of the carrier ring, located closer to the spindle.

In some embodiments, instead of measuring a height of an MCA support or a height of a side of a carrier ring with respect to the level LVL1, the height of the MCA support or of the side of the carrier ring is measured with respect to a level of a top surface of the pedestal 140. In various embodiments, a height of an MCA support is measured with respect to a horizontal plane of the carrier ring 200.

Figure 5A:
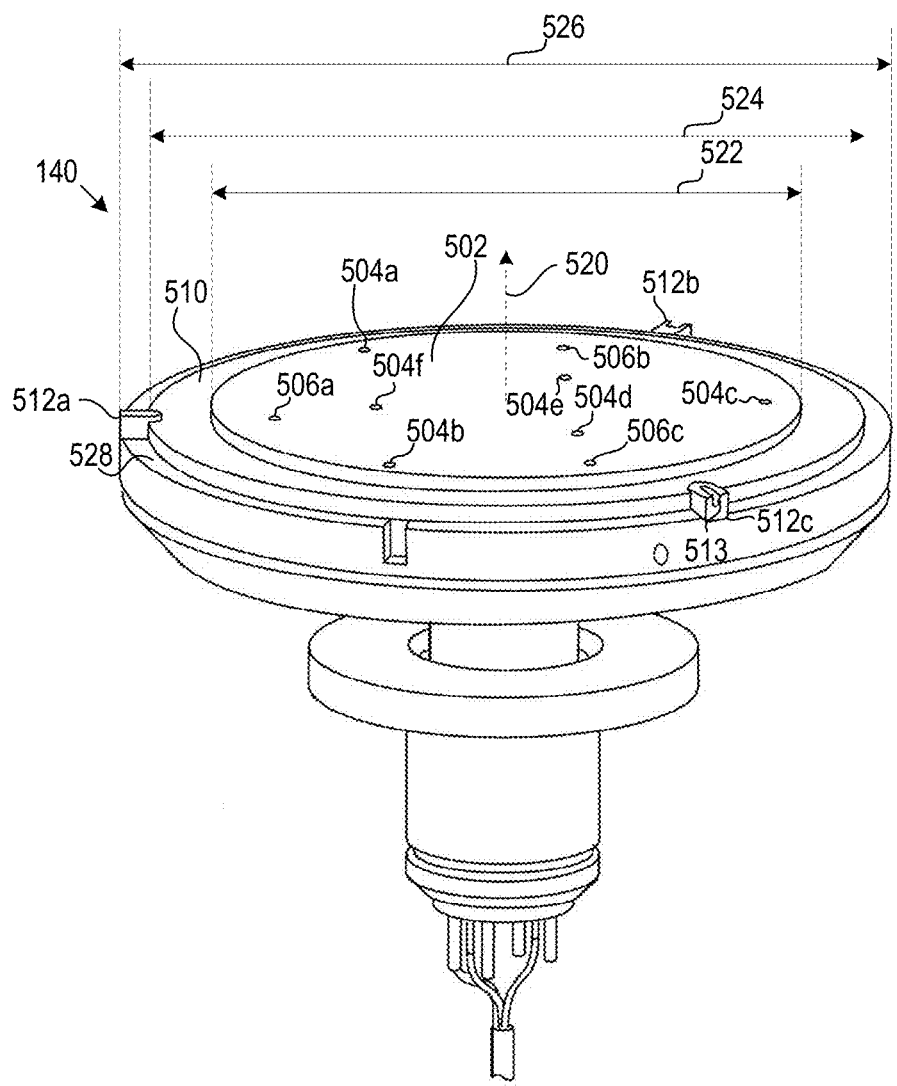
FIG. 5A illustrates a pedestal on which the wafer is placed for performing a deposition process on the wafer, in accordance with some embodiments described in the present disclosure.

FIG. 5A illustrates the pedestal 140 on which a wafer is placed for performing a deposition process, such as an ALD process, on the wafer. The pedestal 140 has a top surface 502 that is defined by a circular area extending from a central axis 520 of the pedestal 140 to a top surface diameter 522 that defines the edge of the central top surface 502. The top surface 502, in some embodiments, acts as a reference level for measuring a height of an MCA support and/or of a carrier ring support. The central top surface 502 includes a plurality of MCA support slots 504a, 504b, 504c, 504d, 504e, and 504f, which are defined on the central top surface 502 and receive MCA supports that support the wafer above the central top surface 502. In some implementations, when all MCA supports used have the same height and none of the MCA supports are raised with respect to any other MCA support of the pedestal, the wafer support level is approximately 2 mil (2000$^{th}$ of an inch) above the central top surface 502 of the pedestal. In various implementations, the MCA support 504a is raised in height compared to the MCA supports 504b and 504c so that wafer support level at a position of the MCA support 504a is 4 mil or 6 mil or 8 mil, wafer support level at a position of the MCA support 504b is 2 mil, and wafer support level at a position of the MCA 504c is 2 mil to tilt the wafer. In the illustrated embodiment, there are six MCA support slots symmetrically distributed about a peripheral portion of the central top surface 502. However, in other implementations there may be any number of MCA support slots on the central top surface 502, which may be distributed about the central top surface 502 in any suitable configuration for receiving the number of MCA supports to support the wafer during deposition process operations. In some embodiments, MCA supports are used to improve precision mating between surfaces when high precision or tolerances are required, and/or minimal physical contact is desirable to reduce defect risk. Additionally shown are recesses 506a, 506b, and 506c, which house lift pins. As noted above, the lift pins are utilized to raise the wafer from the MCA supports to allow for engagement by an end-effector.

The pedestal 140 further includes an annular surface 510 extending from the top surface diameter 522 of the pedestal 140 (which is at the outer edge of the central top surface 502) to an intermediate diameter 524 of the annular surface. The annular surface 510 defines an annular region surrounding the central top surface 502, but at a step down from the central top surface 502. That is, a vertical position of the annular surface 510 is lower than a vertical position of the central top surface 502. A plurality of carrier ring supports 512a, 512b, and 512c, e.g., horse-shoe shaped carrier ring supports, etc., are positioned at or along an edge, e.g., intermediate diameter, etc., of the annular surface 510 and symmetrically distributed about the edge of the annular surface 510. The pedestal 140 also includes another annular surface 528 that is a step down from the annular surface 510. The annular surface 528 defines another annular region, which has an outer diameter 526 and surrounds the annular surface 510. The outer diameter 526 is of the pedestal 140. The carrier ring supports 512a, 512b, and 512c are fitted on top of the annular surface 528. For example, there are slots within the annular surface 528 in which the carrier supports 512a, 512b, and 512c are fitted, e.g., via screws, or bolts, or glue, etc.

The carrier ring supports, in some embodiments, define MCAs for supporting the carrier ring 200. In some implementations, the top surfaces of the carrier ring supports 512a, 512b, and 512c have heights that are slightly higher than that of the annular surface 510. When the carrier ring 200 is resting on the carrier ring supports 512a, 512b, and 512c that are at a predefined distance above the annular surface 510 and the wafer rests on the carrier ring supports, the wafer rests at the pre-defined distance above the central top surface 502 and the annular surface 510. When the carrier ring 200 is resting on the carrier ring supports 512a, 512b, and 512c and one of the carrier ring supports is elevated compared to another one of the carrier ring supports, the wafer is tilted with respect to the central top surface 502 and the annular surface 510. In some embodiments, each carrier ring support 512a, 512b, and 512c includes a recess, such as a recess 513, in which an extension protruding from the underside of the carrier ring 200 is seated when the carrier ring is supported by the carrier ring supports. The mating of the carrier ring extensions to the recesses in the carrier ring supports provides for secure positioning of the carrier ring and prevents the carrier ring from moving when seated on the carrier ring supports. It will be appreciated that when the wafer is supported by the MCA supports and the carrier ring is supported by the carrier ring supports, an edge region of the wafer is disposed over an inner portion of the carrier ring 200.

In the illustrated embodiment, there are three carrier ring supports positioned symmetrically along the outer edge region of the annular surface 510. However, in other implementations, there may be three or more carrier ring supports, distributed at any locations along the annular surface 510 of the pedestal 140, to support a carrier ring in a stable resting configuration.

Figure 5B:
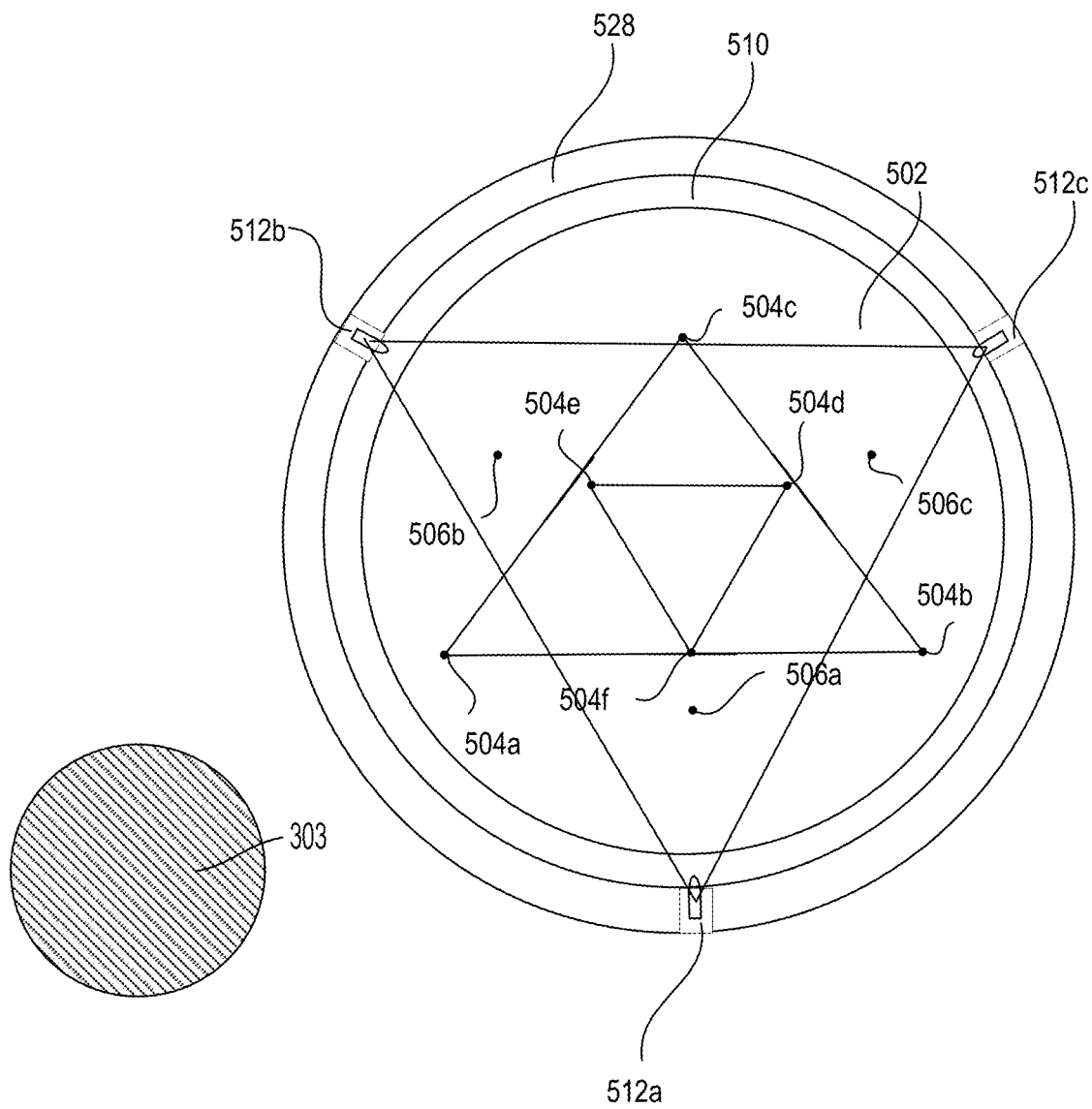
FIG. 5B is a top view of the pedestal to illustrate an embodiment of positions of carrier ring supports, and MCA supports, in accordance with some embodiments described in the present disclosure.

FIG. 5B is a top view of the pedestal 140 to illustrate an embodiment of positions of the carrier ring supports 512a, 512b, and 512c, the MCA supports 504a, 504b, 504c, 504d, 504e, and 504f, and the recesses 506a, 506b, and 506c. The MCA supports 504a, 504b, and 504c are located at vertices of an equilateral triangle. Similarly, the MCA supports 504d, 504e, and 504f are located at vertices of another equilateral triangle, which is inverted with respect to the equilateral triangle formed by the MCA supports 504a, 504b, and 504c. Moreover, the carrier ring supports 512a, 512b, and 512c are located at vertices of another equilateral triangle.

In some embodiments, instead of the triangle with vertices at which the MCA supports 504a, 504b, and 504c are located being an equilateral triangle, the triangle is of another dimension, e.g., an isosceles triangle, etc. Similarly, in various embodiments, instead of the triangle with vertices at which the MCA supports 504d, 504e, and 504f are located being an equilateral triangle, the triangle is of another dimension. Moreover, in several embodiments, instead of the triangle with vertices at which the carrier ring supports 512a, 512b, and 512c are located being an equilateral triangle, the triangle is of another dimension.

Figure 6:
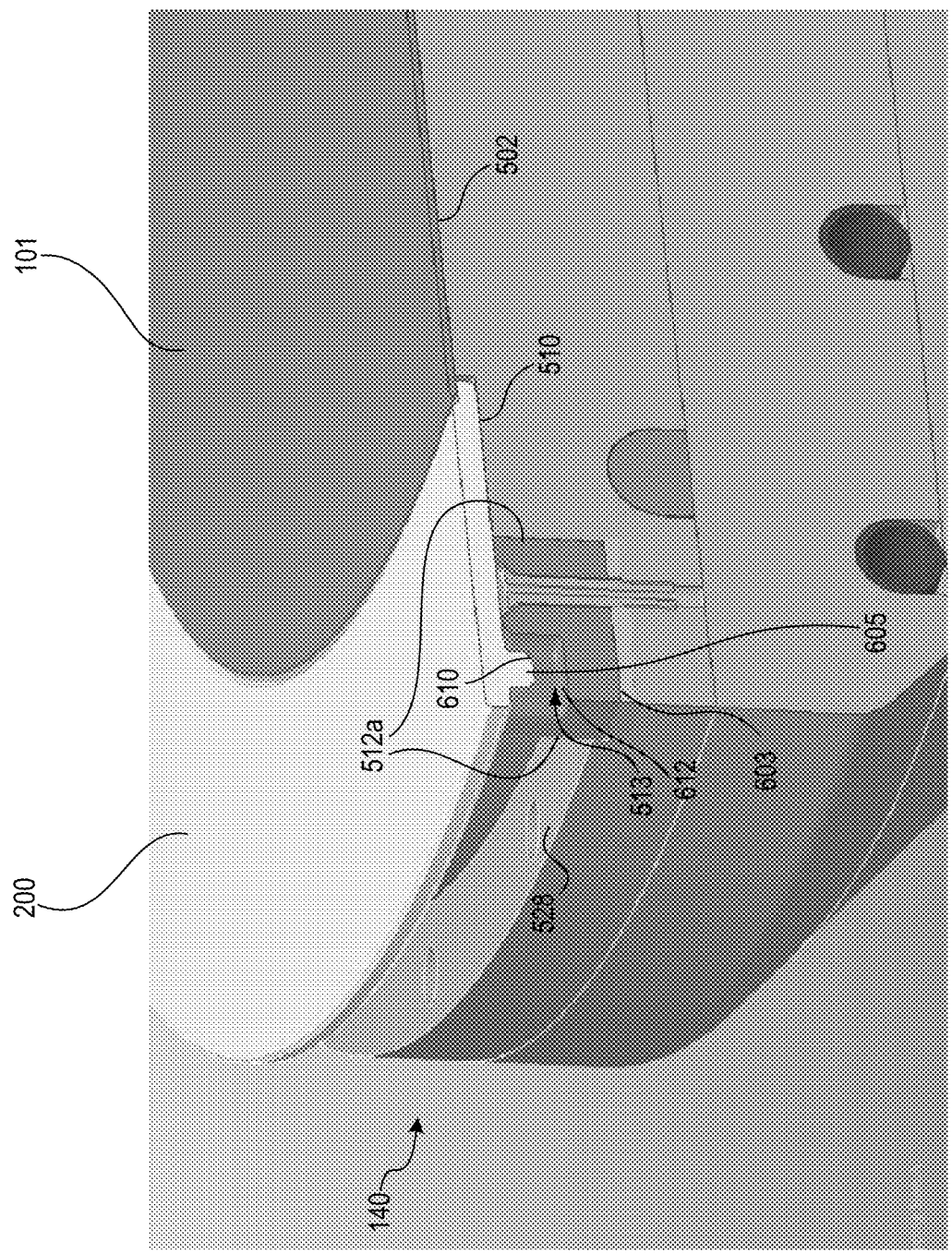
FIG. 6 is a perspective cutaway view of a portion of the pedestal to illustrate a height of the carrier ring without user of a spacer, in accordance with several embodiments described in the present disclosure.

FIG. 6 is a perspective cutaway view of an embodiment of a portion of the pedestal 140 to illustrate a height of the carrier ring 200 without user of a spacer. The cutaway view is a longitudinal section intersecting one of the carrier ring supports, e.g. carrier ring support 512a. A carrier ring 200, which is an example of the carrier ring 200, is shown resting atop the carrier ring support 512a, which rests in a slot 603 formed within the surface 528 of the pedestal 140. The carrier ring support 512a is fitted to the slot 603 via a fastening hardware, which is further described below. In this configuration, a carrier ring extension 605 is seated within a slot 610 formed within the recess 513 of the carrier ring support 512a. Also, the wafer 101 is shown resting over the central top surface 502 of the pedestal (supported by MCA supports). The carrier ring support 512a is located closer towards the spindle compared to the carrier ring support 512c. Similarly, the carrier ring support 512b is located closer to the spindle compared to the carrier ring support 512c. The carrier ring support 512c is located closer to the side walls compared to the carrier ring supports 512a and 512b. The carrier ring support 512a is height adjustable, so as to allow the distance above the annular surface 528 at which the carrier ring is supported to be adjusted. Similarly, the carrier ring support 512b is height adjustable. In FIG. 6, there is no spacer used between the carrier ring support 512a and a surface of the pedestal 140.

Figure 7A:
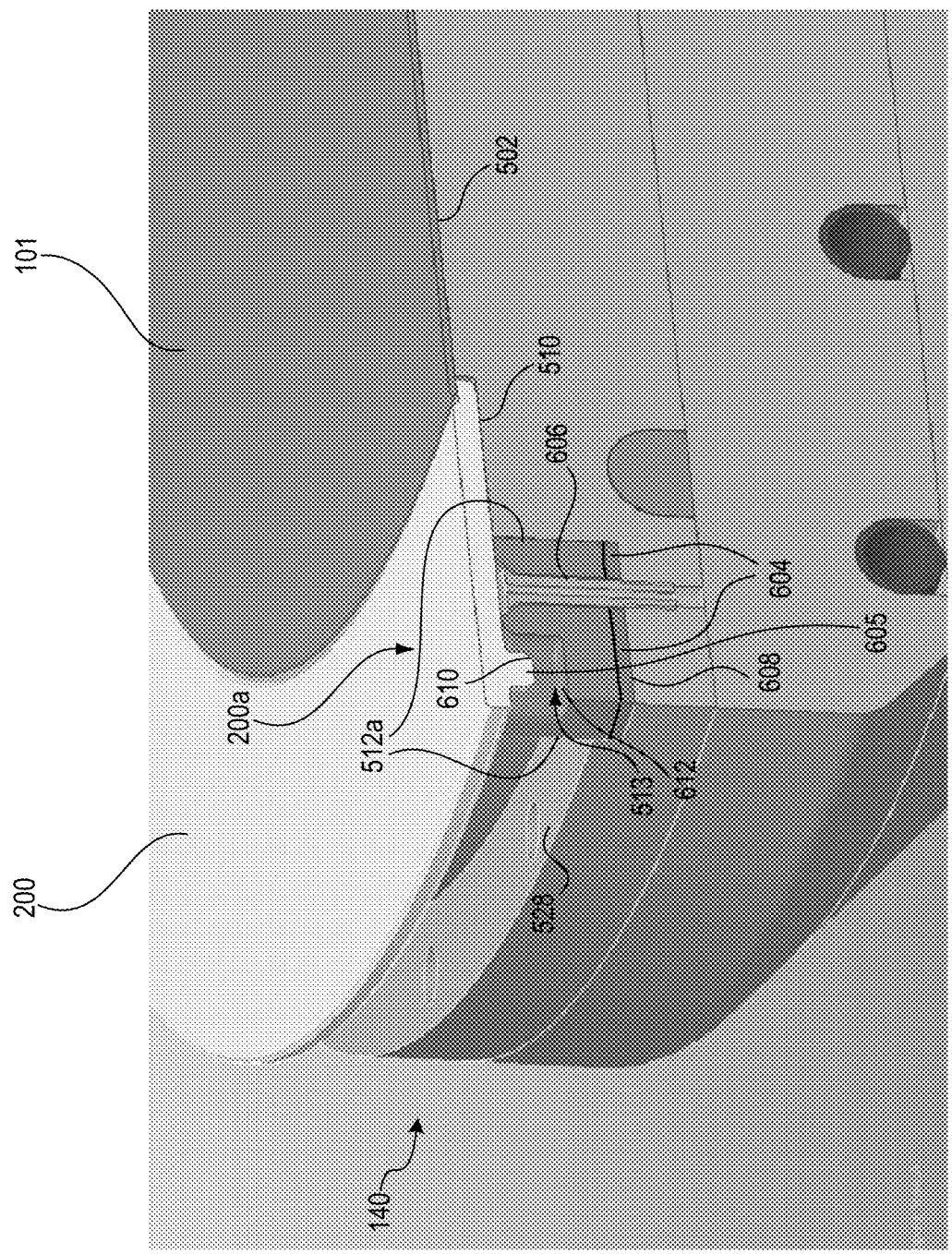
FIG. 7A is a perspective cutaway view of a portion of the pedestal to illustrate use of the spacer to raise a height of the carrier ring at a side of the carrier ring, in accordance with some embodiments described in the present disclosure.

FIG. 7A is a perspective cutaway view of an embodiment of a portion of the pedestal 140 to illustrate use of a spacer 604 to raise a height of the carrier ring 200 at the side 200a of the carrier ring 200. The spacer 604 is sometimes referred to herein as a first layer spacer. The spacer (e.g. a shim, etc.) 604 is placed below the carrier ring support 512a for increasing the height of the carrier ring support 502a. That is, the spacer 604 is selected to provide for a controlled, e.g., a pre-determined, etc., distance between the side 200a of the carrier ring 200 and the central top surface 502 when the carrier ring 200 is resting on the carrier ring support 512a. The central top surface 502 is parallel to the annular surface 528 and the annular surface 510. The spacer 604 is fitted within a slot 608 formed within the annular surface 528 by a fastening hardware 606, examples of which are provided below. By increasing a height of the carrier ring support 512a compared to a height of the carrier ring support 512c with respect to the central top surface 502, the side 200a of the carrier ring 200 is raised compared to the side 200b and a higher amount of deposition occurs on an azimuthal region of the wafer 101 supported by the carrier ring support 512a compared to an azimuthal region supported by the carrier ring support 512c for increasing uniformity in deposition of a film on the wafer 101 at the side 200a. It will be appreciated that there may be zero, one, or more than one spacers selected and positioned beneath the carrier ring support 512a to provide for a desired distance between the central top surface 502 and the carrier ring 200.

The carrier ring support 512a and the spacer 604 are secured to the pedestal 140 by the fastening hardware 606. In some implementations, the fastening hardware 606 is a screw, bolt, nail, pin, or any other type of hardware suitable for securing the carrier ring support 512a and spacer 604 to the pedestal 140. In other implementations, other techniques/materials for securing the carrier ring support 512a and the spacer 604 to the pedestal 140 are utilized, such as a suitable adhesive.

In some embodiments, as explained above, in addition to securing the spacer 604 between the carrier ring support 512 and the slot 608, another spacer, same as the spacer 604, is fastened in a slot, formed on the surface 528, below the carrier ring support 512b to raise the height of the side 200a of the carrier ring 200. The other spacer is fastened in a manner similar to that described above for fastening the spacer 604. Moreover, there is no spacer placed between the surface 528 and the carrier ring support 512c to raise the height of the side 200a of the carrier ring 200 compared to the end 200b.

Figure 7B:
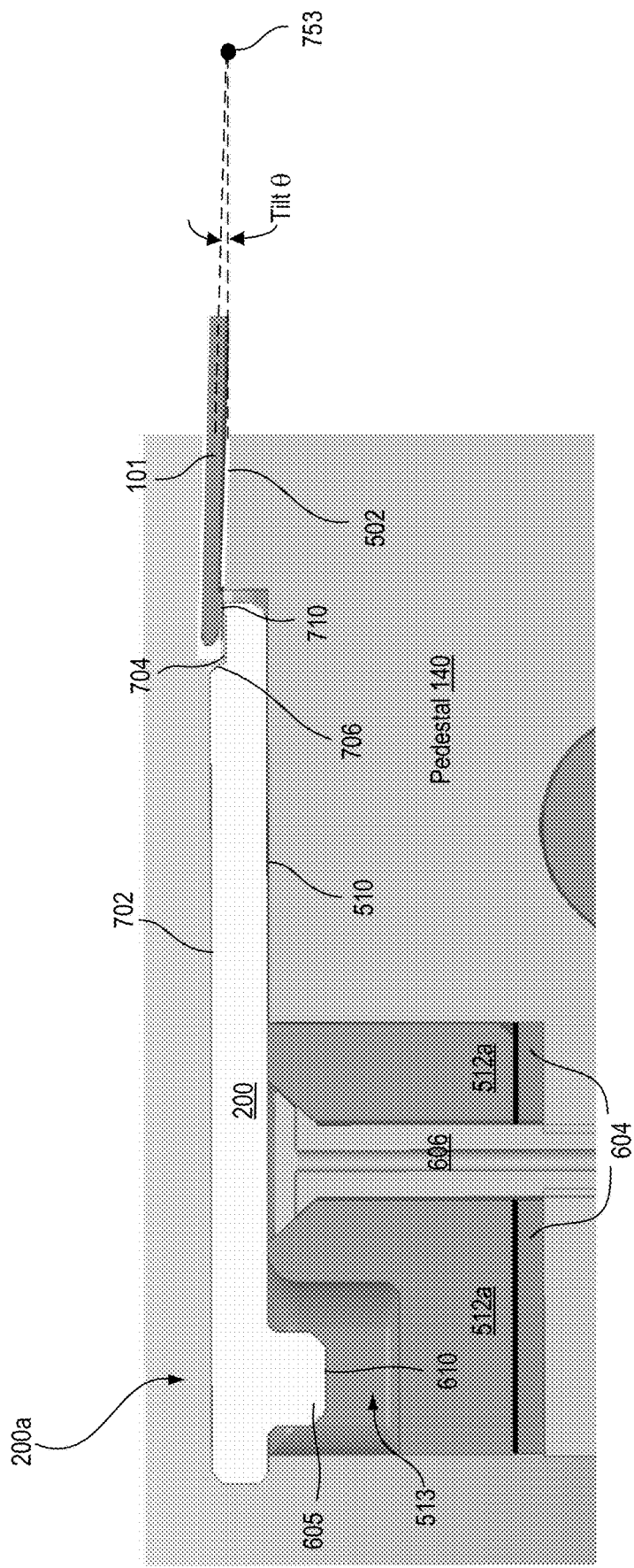
FIG. 7B illustrates a side view of the carrier ring and of the wafer to illustrate tilting of the wafer by raising a height of the side of the carrier ring at a location of a carrier ring support, in accordance with several embodiments described in the present disclosure.

FIG. 7B illustrates a side view of the carrier ring 200 and of the wafer 101 to illustrate tilting of the wafer 101 by raising a height of the side 200a of the carrier ring 200 at a location of the carrier ring support 512a. The wafer 101 is tilted by an angle θ with respect to a horizontal level that extends from a point 753 located at the carrier ring support 512c. In the illustrated embodiment, the carrier ring 200 is an annular body having a top surface 702, and a step down surface 704. The top surface 702 and the step down surface 704 are joined by a transition step 706. It will be appreciated that the step down surface 704 is defined proximate to an inner diameter of the carrier ring, and extends outward from the inner diameter. The top surface 702 extends from the step down surface 704 to an outer diameter of the carrier ring 200. The carrier ring 200 further includes one or more carrier ring wafer supports 710 which are defined along the step down surface 704 of the carrier ring 200. The carrier ring wafer supports 710, in some embodiments, have MCAs and engage a backside of the wafer 101 when the wafer 101 is being supported by the carrier ring 200 (e.g. during transport, etc.).

When the spacer 604 is used to increase a height of the side 200a of the carrier ring to increase a height of the wafer 101 at the azimuthal region that is closer to the spindle compared to the azimuthal region that is closer to the side walls of the lower chamber portion 102b and a spacer is not used to increase a height of the side 200b so that a height of the wafer 101 at the azimuthal region closer to the side walls of the lower chamber portion 102b is lower, a higher amount of deposition occurs on the azimuthal region closer to the spindle compared to the azimuthal region closer to the side walls of the lower chamber portion. The higher amount of deposition increases uniformity in an amount of thickness of a film deposited on the wafer 101.

Figure 8:
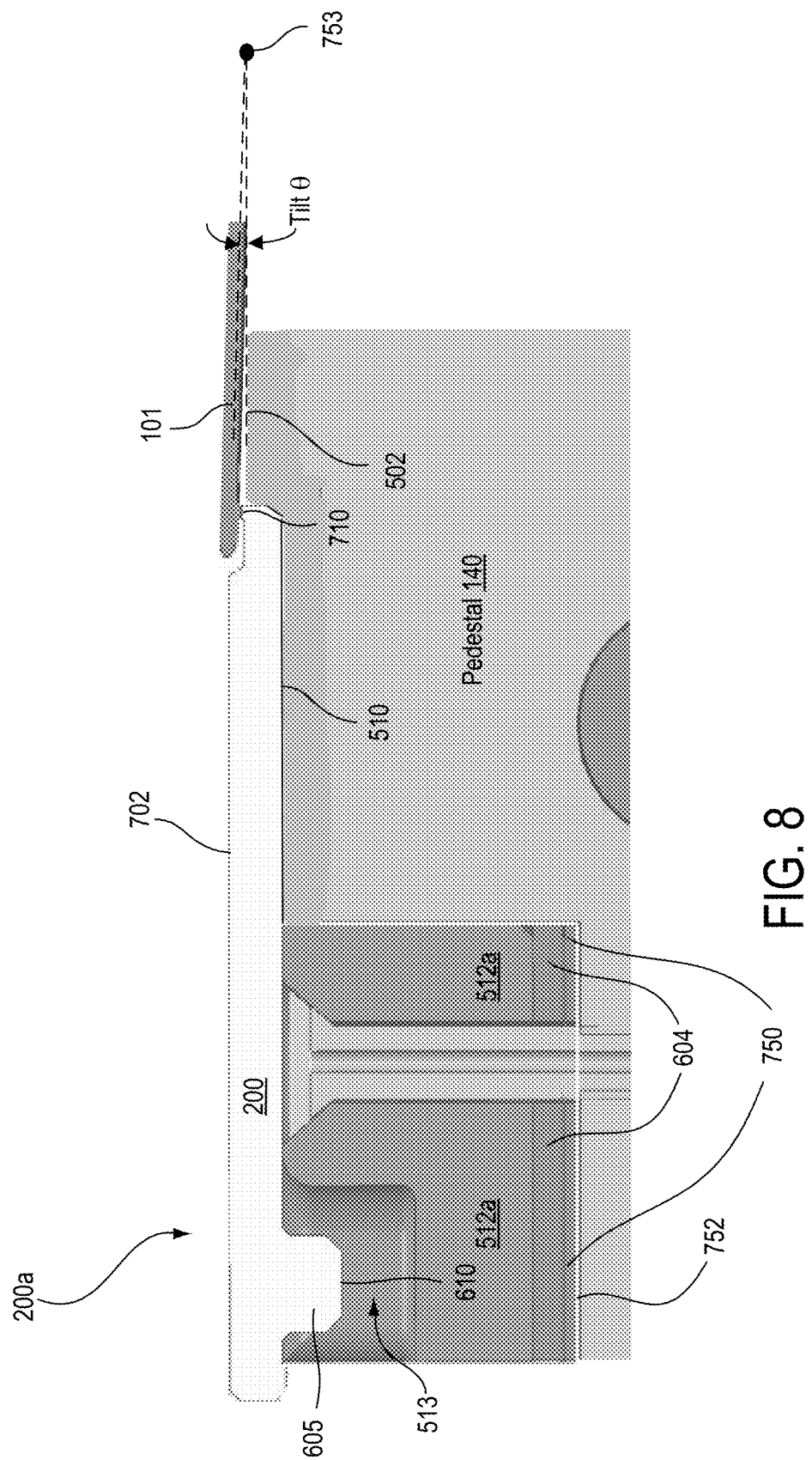
FIG. 8 is a side view of the carrier ring and of the wafer to illustrate tilting of the wafer by further raising a height of the carrier ring at a location of a carrier ring support, in accordance with several embodiments described in the present disclosure.

FIG. 8 is a side view of the carrier ring 200 and of the wafer 101 to illustrate tilting of the wafer 101 by further raising a height of the carrier ring 200 at a location of the carrier ring support 512a. The height of the side 200a of the carrier ring 200 is further raised by placing an additional spacer 750 below the spacer 604. The additional spacer 750 is sometimes referred to herein as a second layer spacer that is placed below the first layer spacer. The additional spacer 750 is located within a slot 752 formed within the annular surface 528. The additional spacer 750 is located between the spacer 604 and a surface of the slot 752. By further raising the height of the side 200a of the carrier ring 200, the side 200a comes closer to the showerhead 150 to allow a higher amount of deposition on the azimuthal region, of the wafer, closer to the spindle compared to an amount of deposition on the azimuthal region, of the wafer, closer to the side walls of the lower chamber portion 102b. Such higher amount of deposition increases an amount of uniformity of deposition on the wafer. It should be noted that while the first and second layer spacers are used between the carrier ring support 512a and the surface of the slot 752 formed within a surface of the pedestal 140, no such first and second layer spacers are used between the carrier ring support 512c and the surface 528 of the pedestal 140 on which the carrier ring support 512c rests.

In a number of embodiments, any number of spacers is used between the carrier ring support 512a and a surface of the pedestal 140 on which the carrier ring support 512a rests. In various embodiments, spacers of different thicknesses are used between the carrier ring support 512a and a surface of the pedestal 140 on which the spacers and the carrier ring support 512a rests.

In some embodiments, in addition to placing the spacer 604 and the additional spacer 750 between the carrier ring support 512a and the slot 752, another spacer, same as the spacer 604, and another additional spacer, same as the additional spacer 750, is placed in a slot, formed on the surface 528, below the carrier ring support 512b to raise the height of the side 200a of the carrier ring 200. Moreover, there is no spacer placed between the surface 528 and the carrier ring support 512c to lower the height of the side 200b of the carrier ring 200 compared to the side 200a.

In various embodiments, the same number of spacers are placed between the carrier ring support 512a and a surface of the pedestal 140 on which the carrier ring support 512a rests as that used between the carrier ring support 512b and the surface of the pedestal 140 on which the carrier ring support 512b rests.

Figure 9:
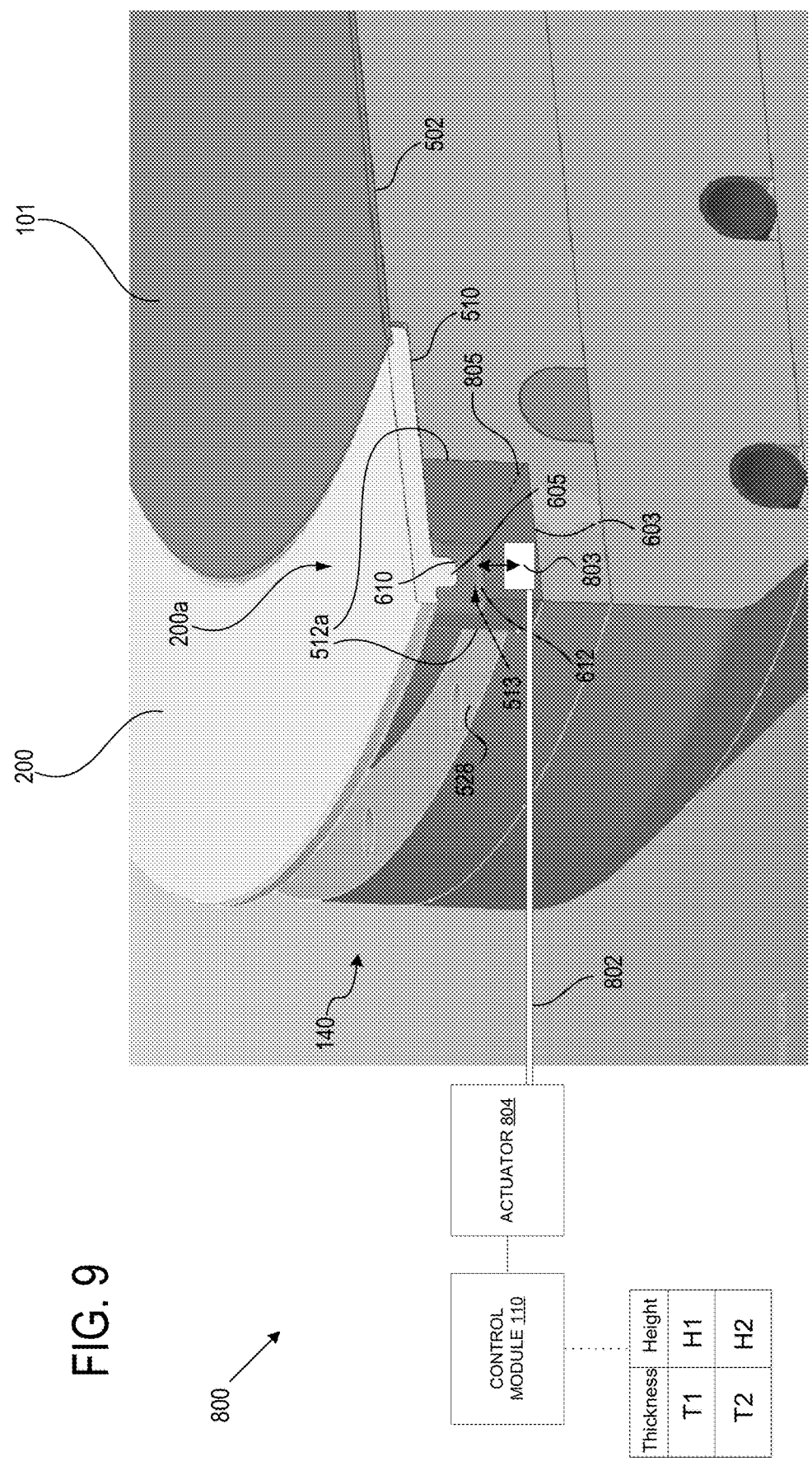
FIG. 9 is a diagram of a carrier ring control system to illustrate use of a calibrated thickness measurement to achieve a pre-determined amount of height of a carrier ring support with respect to a level of a top surface of the pedestal to further achieve a pre-determined thickness of a film deposited in the wafer, in accordance with some embodiments described in the present disclosure.

FIG. 9 is a diagram of an embodiment of a carrier ring control system 800 to illustrate use of a calibrated thickness measurement of a film to achieve a pre-determined amount of height of carrier ring support 512a with respect to a level of the top surface 502 of the pedestal 140. The carrier ring support 512a is connected to one or more connection mechanisms 802, e.g., one or more shafts, or a combination of one or more shafts and one or more gears, etc., to move the carrier ring support 512a in a vertical direction to increase a height of the carrier ring 200 so that an amount of a film deposited on the azimuthal region, of the wafer 101, closer to the spindle of the wafer 101 increases. For example, the carrier ring support 512a is connected to a shaft, which is connected to a gear, which is connected to another gear, which is connected to another shaft. The other shaft is connected to an actuator 804, e.g., a motor, etc. The actuator 804 is connected to the control module 110. As another example, the carrier ring support 512a is connected to a rod, which is connected to the motor. As yet another example, the carrier ring support 512a is connected via a number of rods to the motor. The one or more connection mechanisms 802 include an adjuster 803, e.g., a connector that connects a shaft to carrier ring support 512a, threads of the shaft that mate with corresponding threads within the carrier ring support 512a, etc.

During a calibration procedure, a height of the carrier ring support 512a is calibrated, e.g., determined, calculated, etc., for a pre-determined amount of thickness of a film to be deposited on the region, of the wafer 101, closer to the spindle. For example, during calibration, the processor of the control module 110 sends a signal to a driver, e.g., one or more transistors, etc., to generate a pre-determined amount of current to provide to the actuator 804 to actuate the actuator 804, e.g., rotate a rotor of the motor, etc., by a pre-determined number of rotations or a pre-determined angle of a rotation. The pre-determined number of rotations or the pre-determined angle of a rotation and the pre-determined amount of current correspond, e.g., map to, has one-to-one correspondence with, etc., an increase in height of the wafer compared to a level of the top surface 502 of the pedestal 140. The wafer 101 is taken out of the chamber and then a thickness of the wafer is measured ex-situ by using an optical thickness measurement device, e.g., an interferometer, etc. The optical thickness measurement device is connected to the control module 110. Any measurement of thickness of the wafer 101 is provided from the optical thickness measurement device to the control module 110. An increase in the thickness is associated with, e.g., mapped to, etc., the pre-determined number of rotations or the pre-determined angle of a rotation and the pre-determined amount of current by the control module 110 and stored in the memory device of the control module 110. As another example, during the calibration, it is determined that to increase an amount of thickness of a film deposited during a cycle of deposition on the region, of the wafer 101, closer to the spindle by 0.87 Angstrom, a height of the wafer 101 at the region, of the wafer 101, closer to the spindle is increased by 1 mil. As yet another example, during the calibration, it is determined that to increase an amount of thickness of a film deposited during a cycle of deposition on the region, of the wafer 101, closer to the spindle by 0.87375 Angstrom, a height of the wafer 101 at the region, of the wafer 101, closer to the spindle is increased by 1 mil. As another example, during the calibration, it is determined that to increase an amount of thickness of a film deposited during a cycle of deposition on the region, of the wafer 101, closer to the spindle by 0.87375 Angstrom±10%, a height of the wafer 101 at the region, of the wafer 101, closer to the spindle is increased by 1 mil±10%. As another example, during the calibration, it is determined that to increase an amount of thickness of a film deposited during a cycle of deposition on the region, of the wafer 101, closer to the spindle by 2 Angstrom±10%, a height of the wafer 101 at the region, of the wafer 101, closer to the spindle is increased by 2.3 mil±10%.

During the calibration, a table, shown in FIG. 9, is generated by the processor of the control module 110 and stored in the memory device of the control module 110. The table includes a correspondence between a thickness increase T1 of a film deposited on the wafer 101 at the region, of the wafer 101, closer to the spindle, a height increase H1 of the carrier ring support 512a compared to the level of the top surface 502 for achieving the thickness increase T1, a number of rotations R1 of the rotor or an angle A1 of a rotation of the rotor to achieve the height increase H1, and an amount of current I1 for achieving the number of rotations R1 or achieving the angle A1 of the rotation. Similarly, the table includes a correspondence between a thickness increase T2 of a film deposited on the wafer 101 at the region, of the wafer 101, closer to the spindle, a height increase H2 of the carrier ring support 512a compared to the level of the top surface 502 for achieving the thickness increase T2, a number of rotations R2 of the rotor or an angle A2 of a rotation of the rotor to achieve the height increase H2, and an amount of current I2 for achieving the number of rotations R2 or the angle A2 of a rotation of the rotor. It should be noted that although two correspondences are illustrated, in some embodiments, the table includes any number of correspondences between height increases of the wafer 101 at the region, of the wafer 101, closer to the spindle, thickness increases of a film for deposition on the wafer 101, rotations of the rotor or angles of a rotation of the rotor, and an amount of current to provide to a stator of the motor. It should be noted that in some embodiments, during calibration, a dummy wafer or another wafer is used instead of the wafer 101 during the calibration procedure.

During processing, e.g., ALD deposition, etc., which occurs after the calibration procedure, the processor of the control module 110 accesses the table and receives an input signal from an input device, e.g., a mouse, a keyboard, a stylus, a keypad, etc. The input signal is received when a user selects via the input device the thickness increase T2 to be achieved in the region, of the wafer 101, closer to the spindle of the wafer 101. Upon receiving the input signal, the processor of the control module 110 identifies from the table the corresponding amount of current I2 to provide to the driver. Upon receiving the amount I2, the driver generates a current signal of the magnitude I2 to provides the current signal to the stator of the motor. The rotor of the motor rotates when the stator receives the current signal to move the carrier ring support 512a in a vertical direction. The movement of the carrier ring support 512a in the vertical direction moves the carrier ring 200 in the vertical direction by the height increase H2 to further lift the wafer 101 in the vertical direction to achieve the thickness increase T2 of a film deposited on the wafer 101. It should be noted that the carrier ring support 512a is moved dynamically, e.g., during processing of the wafer, etc., to increase a height of the carrier ring support 512a during the processing.

It should be noted that the one or more connection mechanisms 802 are not embedded within the pedestal 140 to control a height of the carrier ring support 512a. This saves costs, labor, and time associated with modifying the pedestal 140 to embed the one or more connection mechanisms 802. The height of the carrier ring support 512a is controlled externally via the one or more connection mechanisms 802 by the actuator 804 and the control module 110 when no part of the pedestal 140 is modified.

In various embodiments, the carrier ring support 512b is moved in the vertical direction via an actuator, same as the actuator 804, and one or more connection mechanisms, same as the one or more connection mechanisms 802, to increase a height of the carrier ring support 512b to further increase the height of the side 200a of the carrier ring 200. For example, the carrier ring support 512b is raised by the same height as that of the carrier ring support 512a and simultaneous with the movement of the carrier ring support 512a. Moreover, in these embodiments, the carrier ring support 512c is not moved in the vertical direction when the carrier ring supports 512a and 512b are moved in the vertical direction to tilt the wafer 101 to increase an amount of deposition in the region, of the wafer 101, closer to the spindle. It should be noted that the carrier ring support 512b is moved dynamically, e.g., during processing of the wafer, etc., to increase a height of the carrier ring support 512b during the processing.

In some embodiments, the actuator 804 is a power source instead of the motor. Examples of the power source include one or more transistors. Moreover, a heating element, e.g., a heater, a metal block, a spacing that expands vertically when heat is applied and contracts vertically when the heat is removed, etc., is placed below the carrier ring support 512a. The heating element is located between the carrier ring support 512a and a bottom surface of the slot 608 (FIG. 7A). The power source is connected to the heating element via a cable, which is an example of a connection mechanism, and is connected to the control module 110 via another cable. Also, in these embodiments, the table stores correspondences among height increases of the carrier ring support 512a compared to the level of the top surface 502 of the pedestal 140, amounts of currents to be generated by the power source, and thickness increases of the film to be deposited on the region, of the wafer 101, closer to the spindle. The correspondences are generated during a calibration procedure. The processor of the control module 110 receives an input signal when a selection of the thickness increase T1 is made by the user via the input device. The processor identifies a corresponding amount of current to be generated by the power source from the table and sends a signal to the power source. Upon receiving the signal, the power source generates the amount of current and provides the current to the heating element to heat the heating element. When the heating element heats, a height of the carrier ring support 512a increases in the vertical direction by the amount H1 to move the carrier ring 200 in the vertical direction to further lift the wafer 101 in the vertical direction. The increase in height facilitates a higher amount of deposition of an atomic layer on a top surface at the region, of the wafer 101, closer to the spindle, to further achieve uniformity in deposition on the wafer 101.

In various embodiments, a power source and a heating elements, similar to that used for the carrier ring support 512a, is used to change a height of the carrier ring support 512b.

In several embodiments, when the wafer 101 is tilted, one or more MCA supports are controlled using motors, one or more connection mechanisms, and the control module 110 to reduce deflection of the wafer 101 between the region, of the wafer 101, closer to the spindle and the region, of the wafer 101, closer to the side walls of the lower chamber portion 102b. For example, calibration is performed to determine correspondences between amounts of currents to be provided to the driver by the control module 110 to rotate a motor to further change a height of an MCA support and amounts of reduction in deflection in a local region in which a portion of the wafer 101 or another wafer is supported by the MCA support. During processing of the wafer 101, an amount of current is provided from the control module 110 to the driver to rotate a motor to increase a height of the MCA support to reduce a deflection in a region of the wafer 101 local to the MCA support. In various embodiments, instead of the motor, power sourced and heater elements are used to reduce the amount of deflection by changing heights of MCA supports.

In several embodiments, instead of moving the carrier ring support 512 in a vertical direction, the carrier ring support 512a is tilted to tilt the carrier ring 200 at the side 200a. For example, the carrier ring support 512a is tilted with respect to an edge 805 of the carrier ring support 512a adjacent to the pedestal 140 by using the one or more connection mechanisms 802, the actuator 804, and the control module 110.

Figure 10:
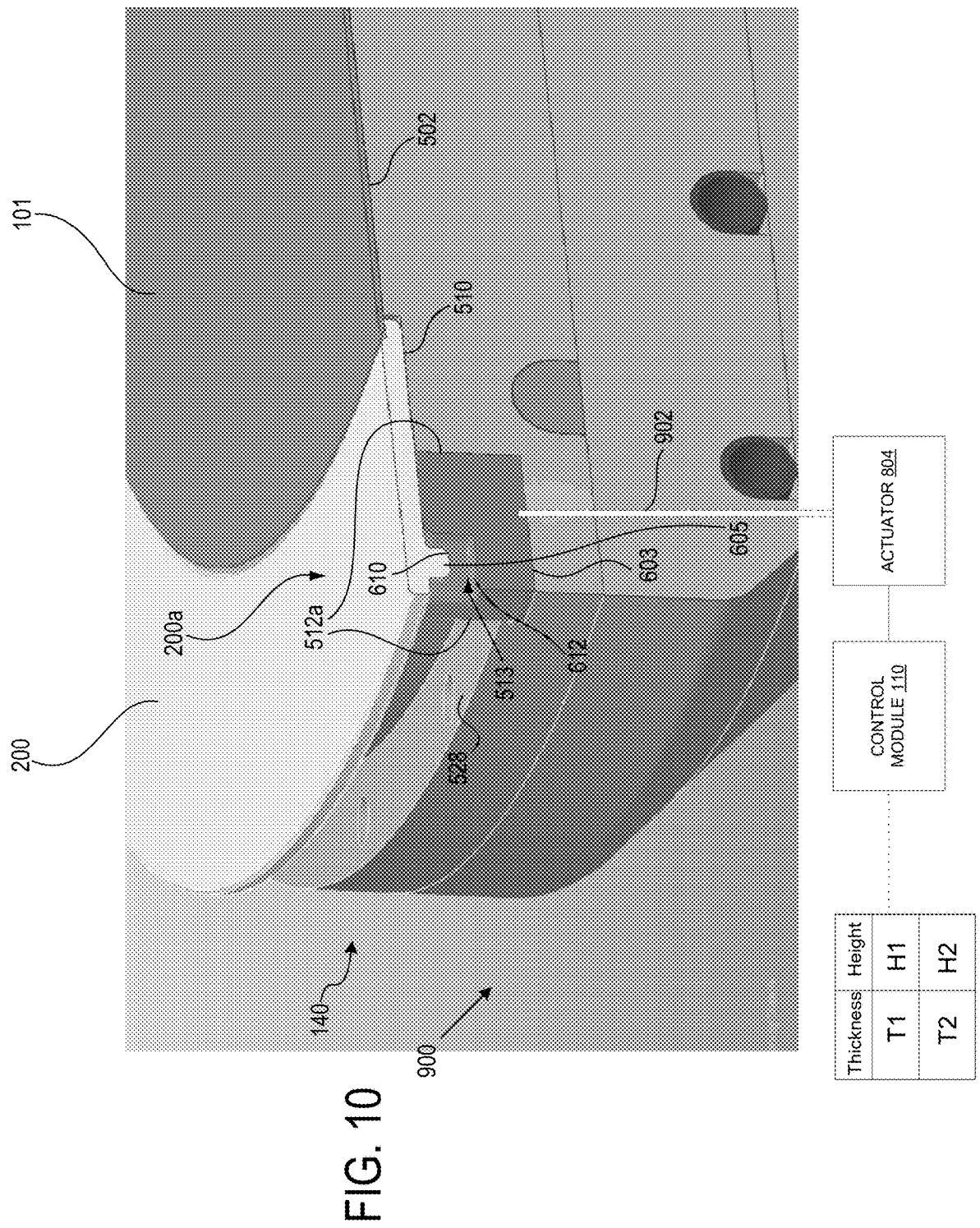
FIG. 10 is a diagram of a system to illustrate a control of height of the wafer at a region, of the wafer, closer to the spindle by integrating one or more portions of one or more connection mechanisms within the pedestal, in accordance with various embodiments described in the present disclosure.

FIG. 10 is a diagram of an embodiment of another system 900 to illustrate a control of height of the wafer 101 at the region, of the wafer 101, closer to the spindle with respect to the region, of the wafer 101, closer to the side walls of the lower chamber portion 102b. The height is controlled by integrating one or more portions of one or more connection mechanisms 902 within the pedestal 140. For example, the one or more connection mechanisms 902 include a shaft that is connected to a bottom surface of the carrier ring support 512a and the shaft is connected via one or more gears to another shaft that is connected to the rotor of the actuator 804. The shaft connected to the bottom surface of the carrier ring support 512a passes through a passage formed in the pedestal 140. The one or more gears translate a rotational motion of the rotor into a linear motion of the shaft that is connected to the bottom surface of the carrier ring support 512a. Calibration procedures that are performed using the system 800 are performed using the system 900 and processing of the wafer 101 is done in a manner similar to that described above with respect to FIG. 9. For example, after calibration, the table, shown in FIG. 10, is used to control a height of the carrier ring support 512a to further control, e.g., increase, decrease, etc., height of the wafer 101 at the region, of the wafer 101, closer to the spindle.

In various embodiments, the carrier ring support 512b is moved in the vertical direction via an actuator, same as the actuator 804, and one or more connection mechanisms, same as the one or more connection mechanisms 902, to increase a height of the carrier ring support 512b to further increase the height of the side 200a of the carrier ring 200. For example, the carrier ring support 512b is raised by the same height as that of the carrier ring support 512a and simultaneous with the movement of the carrier ring support 512a. Moreover, in these embodiments, the carrier ring support 512c is not moved in the vertical direction when the carrier ring supports 512a and 512b are moved in the vertical direction to tilt the wafer 101 to increase an amount of deposition in the region, of the wafer 101, closer to the spindle.

In some embodiments, the one or more connection mechanisms 902 having one or more portions integrated within the pedestal 140 are a cable that is connected to the power source, which is another example of the actuator 804. In these embodiments, a height of the carrier ring support 512a is controlled by heating the heating element as described above.

It should be noted that in an embodiment, the embodiments of FIGS. 7A, 7B, 8, 9, and 10 apply to the carrier ring support 512b in addition to the carrier ring support 512a. For example, a height of the carrier ring support 512b is raised in addition to the height of the carrier ring support 512a in the same manner as described above using FIGS. 7A, 7B, 8, 9, and 10.

Figure 11:
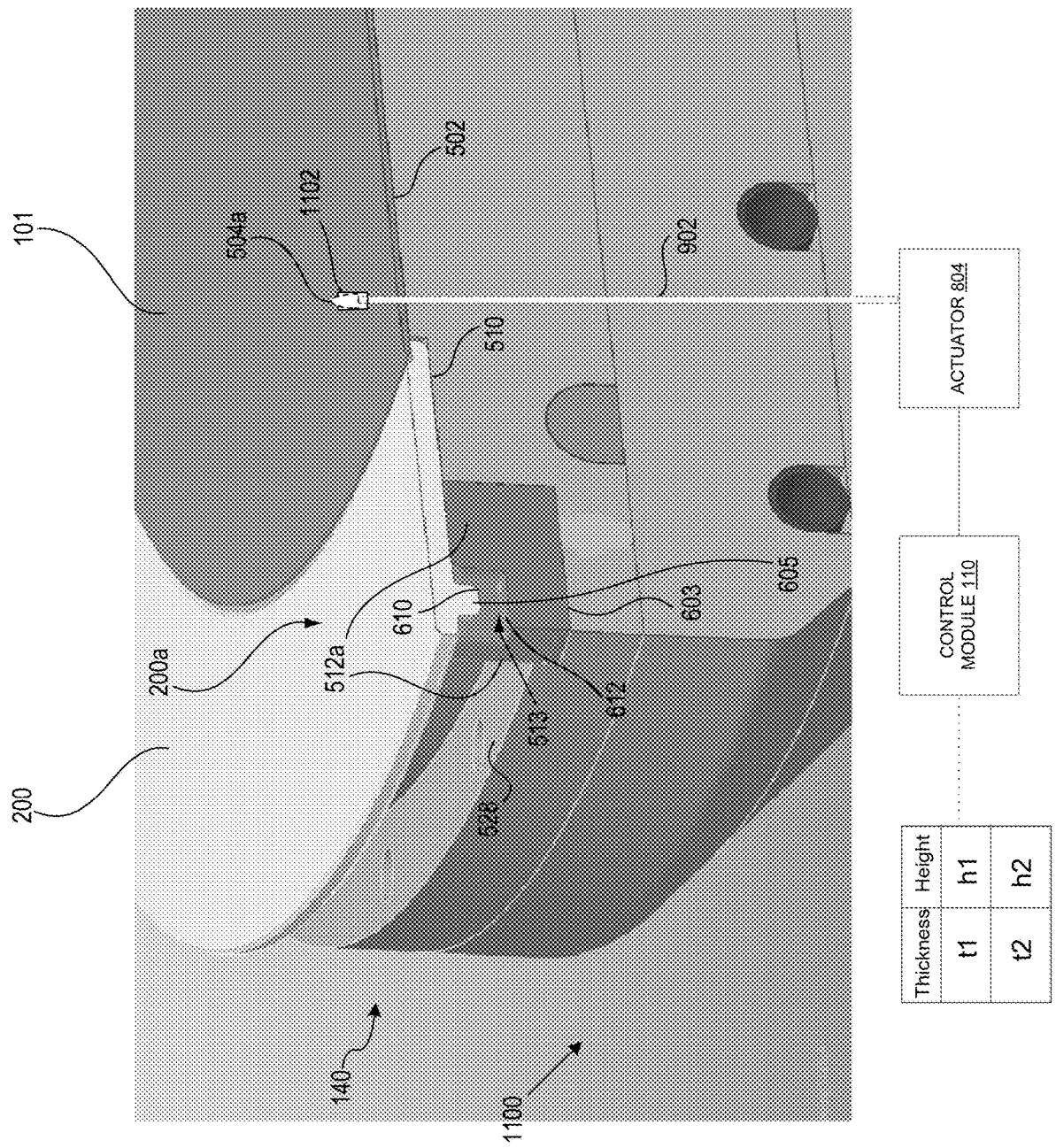
FIG. 11 is an isometric view to illustrate use of an actuator and a control module to change a height of an MCA support, in accordance with various embodiments described in the present disclosure.

FIG. 11 is an isometric view including a system 1100 to illustrate user of the actuator 804 and the control module 110 to change a height of the MCA support 504a. The actuator 804 is connected via the one or more connection mechanisms 902 to the MCA support 504a, whose height is to be changed. The MCA support 504a is located underneath the wafer 101 to support the wafer 101 with minimal contact. The MCA support 504a is located within a housing 1102. For example, the MCA support 504a slides along and within the housing 1102 to change a height of the MCA support 504a with respect to the top surface 502 of the pedestal 500. The housing 1102 provides support and vertical directionality to the MCA support 504a. The one or more connection mechanisms 902 pass via a body of the pedestal 140 to be connected to the MCA support 504a.

A height of the MCA support 504a is calibrated so that a pre-determined amount of thickness of a film is deposited on the region, of the wafer 101, closer to the spindle. For example, during the calibration procedure for calibrating the MCA support 504a, the processor of the control module 110 sends a signal to a driver to generate a pre-determined amount of current to provide to the actuator 804 to actuate the actuator 804 by a pre-determined number of rotations or a pre-determined angle of a rotation. The pre-determined number of rotations or the pre-determined angle of a rotation and the pre-determined amount of current correspond to an increase in height of the wafer at a region closer to the spindle compared to a level of the top surface 502 of the pedestal 140. The wafer 101 is taken out of the chamber and then a thickness of the wafer is measured ex-situ by using the optical thickness measurement device, and the measurement of thickness of the wafer 101 is provided from the optical thickness measurement device to the control module 110. An increase in the thickness is associated with, e.g., mapped to, etc., the pre-determined number of rotations or the pre-determined angle of rotation and the pre-determined amount of current by the control module 110 and stored in the memory device of the control module 110.

During the calibration procedure for calibrating the MCA support 504a, a table, shown in FIG. 11, is generated by the processor of the control module 110 and stored in the memory device of the control module 110. The table includes a correspondence between a thickness increase t1 of a film deposited on the wafer 101 at the region, of the wafer 101, closer to the spindle, a height increase h1 of the MCA support 504a compared to the level of the top surface 502 for achieving the thickness increase t1, a number of rotations r1 of the rotor or an angle a1 of a rotation of the rotor to achieve the height increase h1, and an amount of current i1 for achieving the number of rotations r1 or the angle a1. Similarly, the table includes a correspondence between a thickness increase t2 of a film deposited on the wafer 101 at the region, of the wafer 101, closer to the spindle, a height increase h2 of the MCA support 504a compared to the level of the top surface 502 for achieving the thickness increase t2, a number of rotations r2 of the rotor or an angle a2 of a rotation of the rotor to achieve the height increase h2, and an amount of current i2 for achieving the number of rotations r2 or the angle a2. It should be noted that although two correspondences are illustrated, in some embodiments, the table includes any number of correspondences between height increases of the MCA support 504a at the region, of the wafer 101, closer to the spindle, thickness increases of a film for deposition on the wafer 101, rotations of the rotor or angles of a rotation of the rotor, and an amount of current to provide to a stator of the motor. It should be noted that in some embodiments, during the calibration procedure, a dummy wafer or another wafer is used instead of the wafer 101.

During processing, which occurs after the calibration procedure for calibrating the MCA support 504a, the processor of the control module 110 accesses the table and receives an input signal via the input device. The input signal is received when a user selects the thickness increase t2 via the input device to be achieved in the region, of the wafer 101, closer to the spindle of the wafer 101. Upon receiving the input signal, the processor of the control module 110 identifies from the table the corresponding amount of current i2 to provide to the driver. Upon receiving the amount i2, the driver generates a current signal of the magnitude i2 to provide the current signal to the stator of the motor. The rotor of the motor rotates when the stator receives the current signal to move the MCA support 504a in a vertical direction. The movement of the MCA support 504a in the vertical direction changes a position of the wafer 101 in the vertical direction to lift the wafer 101 in the vertical direction to further achieve the thickness t2 of a film deposited on the wafer 101. It should be noted that the MCA support 504a is moved dynamically, e.g., during processing of the wafer, etc., to increase a height of the MCA support 504a during the processing.

In some embodiments, the actuator 804 is a power source instead of a motor. Moreover, a heating element that expands vertically when heat is applied and contracts vertically when the heat is removed, etc., is placed below the MCA support 504a, e.g., in a slot in which the MCA support 504a is located, etc. The heating element is located between the MCA support 504a and a bottom surface of the slot formed on the top surface 502 of the pedestal 500. The power source is connected to the heating element via a cable and is connected to the control module 110 via another cable. Also, in these embodiments, the table, shown in FIG. 11, stores correspondences between thickness increases of the film to be deposited on the region, of the wafer 101, closer to the spindle, height increases of the MCA support 504a compared to the level of the top surface 502 of the pedestal 140, and amounts of currents to be generated by the power source. The correspondences are generated during a calibration procedure. The processor of the control module 110 receives an input signal when a selection of the thickness increase t1 is made by the user via the input device. The processor identifies a corresponding amount of current to be generated by the power source from the table and sends a signal to the power source. Upon receiving the signal, the power source generates the amount of current and provides the current to the heating element to heat the heating element. When the heating element heats, a height of the MCA support 504a increases in the vertical direction to lift the wafer 101 in the vertical direction. The increase in height facilitates a higher amount of deposition of an atomic layer on a top surface at the region, of the wafer 101, closer to the spindle, to further achieve uniformity in deposition on the wafer 101.

In some embodiments, instead of using the actuator 804, a first MCA support is replaced manually with a second MCA support to change a height of the first MCA support. For example, the MCA support 504a is manually unfitted, e.g., unscrewed, etc., from a slot within the top surface 502 of the pedestal 140 to replace the MCA support 504a with another MCA support of a higher height than the MCA support 504a. The second MCA support is fitted to the top surface 502 using a fastening mechanism.

In various embodiments, the MCA supports 504b, 504c, 504d, 504e, and 504f are not moved in the vertical direction when the MCA support 504a is moved in the vertical direction to tilt the wafer 101 to increase an amount of deposition in the region, of the wafer 101, closer to the spindle.

In several embodiments, height of the MCA support 504a is changed in addition to changing the heights of the carrier ring supports 512a and 512b to tilt the wafer 101.

In some embodiments, the system 1100 excludes the housing 1102.

Figure 12:
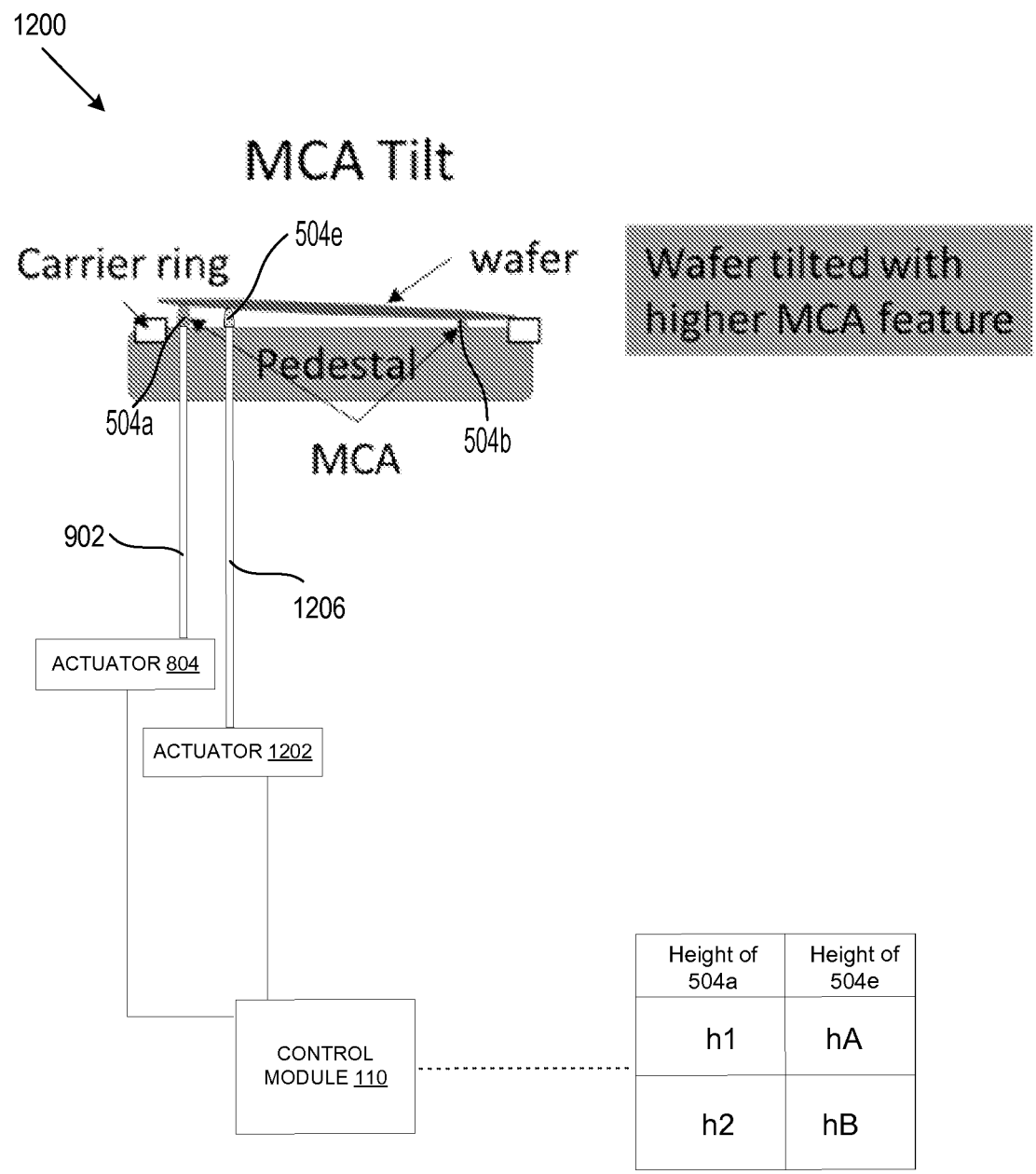
FIG. 12 is a diagram of an embodiment of a system to illustrate a control of height of an MCA support to reduce deflection in the wafer, in accordance with various embodiments described in the present disclosure.

FIG. 12 is a diagram of an embodiment of a system 1200 to illustrate a control of height of an MCA support to reduce deflection in the wafer 101. The system 1200 includes an actuator 1202 that is connected to the MCA support 504e and to the control module 110. The actuator 1202 is connected via one or more connection mechanisms 1206 to the MCA support 504e. The one or more connection mechanisms 1206 are the same in structure to the one or more connection mechanisms 902. The one or more connection mechanisms 1206 pass through the pedestal 140 to connect to the MCA support 504e.

During calibration, a height of the MCA support 504e is determined to reduce deflection of the wafer at a local region at which there is contact between the MCA support 504e and the wafer. For example, when the height of the MCA support 504a is calibrated to be h1, a deflection measurement system, e.g., one available from Toho Technology™ or another entity, etc., is coupled to the wafer to determine an amount of deflection at the local region at which there is contact between the MCA support 504e and the wafer. As an example, a deflection management system includes a beam source for generating beams and a charge coupled device that detects beams that are reflected from a local region on the wafer. The reflected beams are processed by the deflection management system to calculate an amount of deflection at the local region. The deflection amount is provided to the control module 110 that is connected to the deflection measurement system. The control module 110 controls the actuator 1202 to reduce the deflection in the local region at which the MCA support 504e contacts the wafer until the amount of deflection measured by the deflection measurement system matches a pre-determined amount of deflection. A height hA at which the deflection at the local region at which the MCA support 504e contacts the wafer is of the pre-determined amount is stored in a table illustrated in FIG. 12. The table is stored in the memory device of the control module 110. The height hA corresponds to the height h1 of the MCA support 504a. Similarly, another height hB of the MCA support 504e is calculated and stored within the table illustrated in FIG. 12. The height hB corresponds to the height h2 of the MCA support 504a.

During processing of the wafer 101 performed after the calibration, the control module 110 controls the actuator 804 so that the height of the MCA support 504a is h2. When the height of the MCA support 504a is h2, the control module 110 further controls the actuator 1202, which increases the height of the MCA support 504e to hB via the one or more connection mechanisms 1206. When the height of the MCA support 504e is hB, an amount of deflection in the local region at which there is contact between a surface of the MCA support 504e and a bottom surface of the wafer 101 is reduced.

In some embodiments, in addition to or instead of increasing a height of the MCA support 504e, a height of the MCA support 504f is increased in a manner similar to increasing the height of the MCA support 504e to reduce deflection of the wafer 101.

Figure 13:
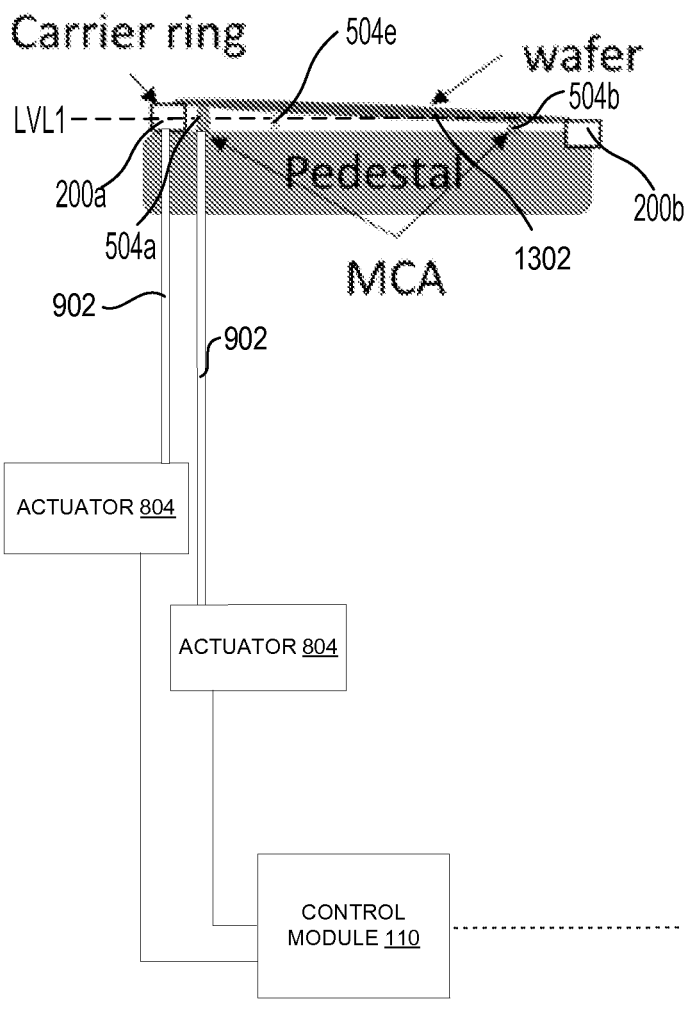
FIG. 13 is a diagram of a system to illustrate use of one or more MCA supports of a station and/or one or more carrier ring supports of the station to reduce an amount of deposition on a backside of the wafer, in accordance with some embodiments described in the present disclosure.

FIG. 13 is a diagram of an embodiment of a system 1300 to illustrate use of one or more MCA supports and one or more carrier ring supports of a station to reduce an amount of deposition on a backside of the wafer 101. When a height of the MCA support 504a is increased, a height of the carrier ring support 512a is increased, and/or a height of the carrier ring support 512b is increased to increase amounts of minimal contact areas on a backside 1302 of the wafer 101. For example, a height of the MCA support 504a is increased first and then heights of the carrier ring supports 512a and 512b are increased. As another example, height of the MCA support 504a is increased first and then heights of the carrier ring supports 512a and 512b and height of the MCA support 504e are increased. The backside 1302 faces the top surface 502 of the pedestal 140. The increase in a number of minimal contact areas on the backside of the wafer 101 reduces changes of deposition of a thin film on the backside of the wafer 101. The number of minimal contact areas increases when one or both of the carrier ring supports 512a and 512b contact the backside 1302 of the wafer 101.

Figure 14A:
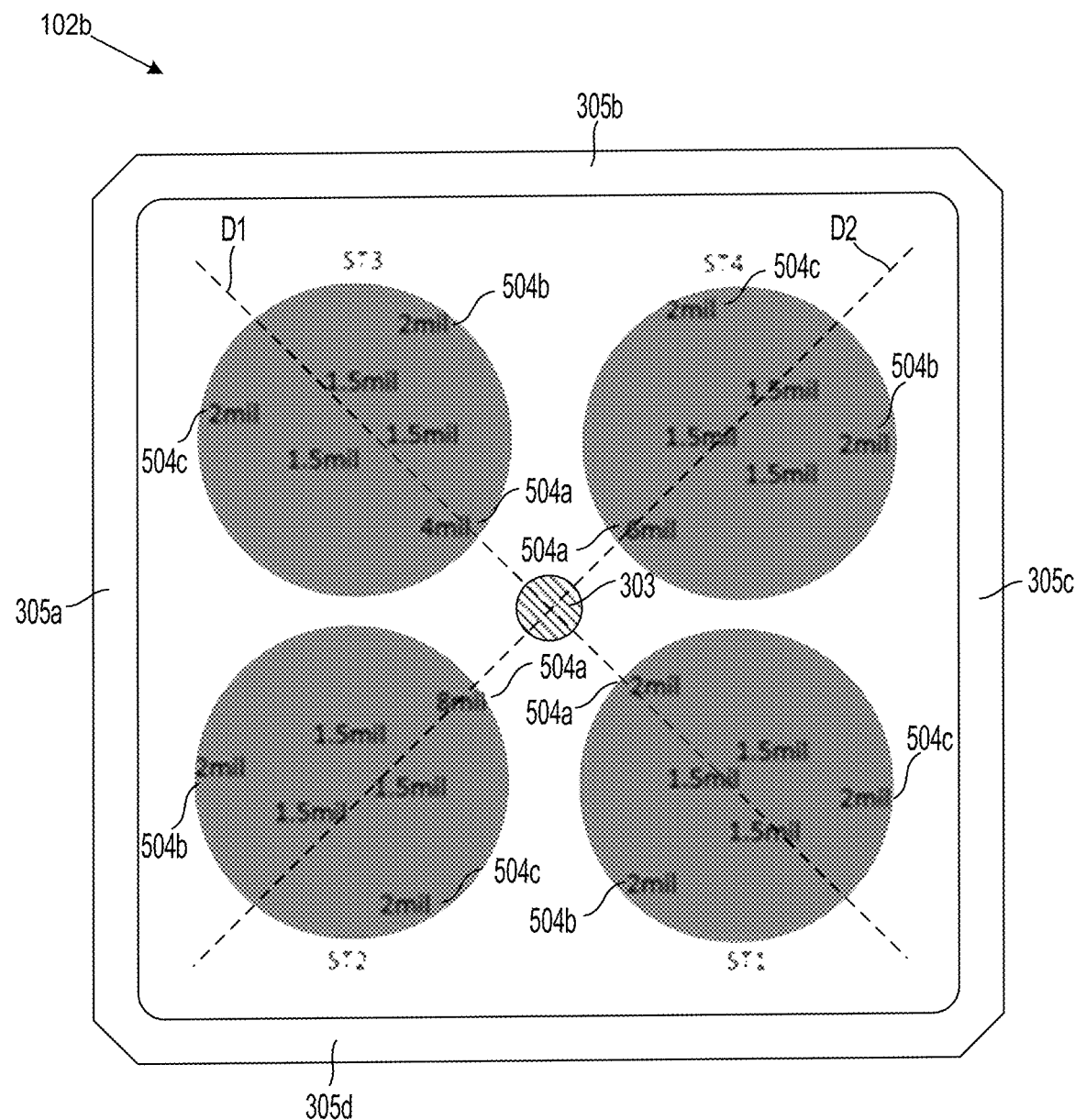
FIG. 14A is a diagram illustrating an increase in heights of wafers at locations closer to a spindle for multiple stations, in accordance with some embodiments described in the present disclosure.

FIG. 14A is a diagram of an embodiment illustrating an increase in a height of the wafer 101 processed at the station 2, a height of the wafer 101 processed at the station 3, and a height of the wafer 101 processed at the station 4. The height of the wafer 101 is increased by increasing either a height of the MCA support 504a at each of the stations 2, 3, and 4 while keeping height of the MCA supports 504b and 504c at each of the stations 2, 3, and 4 lower than the height of the MCA support 504a. The MCA supports 504a for each of the stations ST1 thru ST4 are located along diagonal axes. For example, the MCA supports 504a of the stations ST1 and ST3 are located on the diagonal axis D1 and the MCA supports 504a of the station ST2 and ST4 are located on the diagonal axis D2. In some embodiments, the diagonal D1 is perpendicular to the diagonal D2. In various embodiments, the diagonal D1 is substantially perpendicular to each other, e.g., ranging between 85 degrees and 95 degrees with respect to each other, etc. There is no increase in height of the MCA supports 504a, 504b, and 504c at the station 1. The MCA support 504a for each of the stations 1 thru 4 are located closer to the spindle 303 compared to the MCA supports 504b and 504c. Moreover, the MCA supports 504b and 504c for each of the stations 1 thru 4 are located closer to corresponding side walls from the side walls 305a thru 305d compared to the MCA support 504a for each of the stations 1 thru 4. For example, the MCA support 504b of the station 3 is located closer to the side walls 305a and 305b of the lower chamber portion compared to the MCA support 504a of the station 3. As another example, the MCA support 504c of the station 1 is located closer to the side walls 305c and 305d of the lower chamber portion compared to the MCA support 504a of the station 1.

It should be noted that in some embodiments, heights of the MCA support 504a for each of the stations 2, 3, and 4 is increased by a different amount than that illustrated in FIG. 10A. For example, height of the MCA support 504a for the station 2 is 6 mil instead of 8 mil. As another example, height of the MCA support 504a for the station 3 is 3 mil instead of 4 mil.

In various embodiments, the MCA support 504a of one or more of the stations 1 thru 4 has an increased height compared to the MCA support 504b and 504c of the one or more stations. For example, the MCA support 504a of the station 1 is elevated compared to the MCA 504b and 504c of the station 1 and the MCA support 504a of the station 4 has the same height as that of the MCA supports 504b and 504c of the station 4.

Figure 14B:
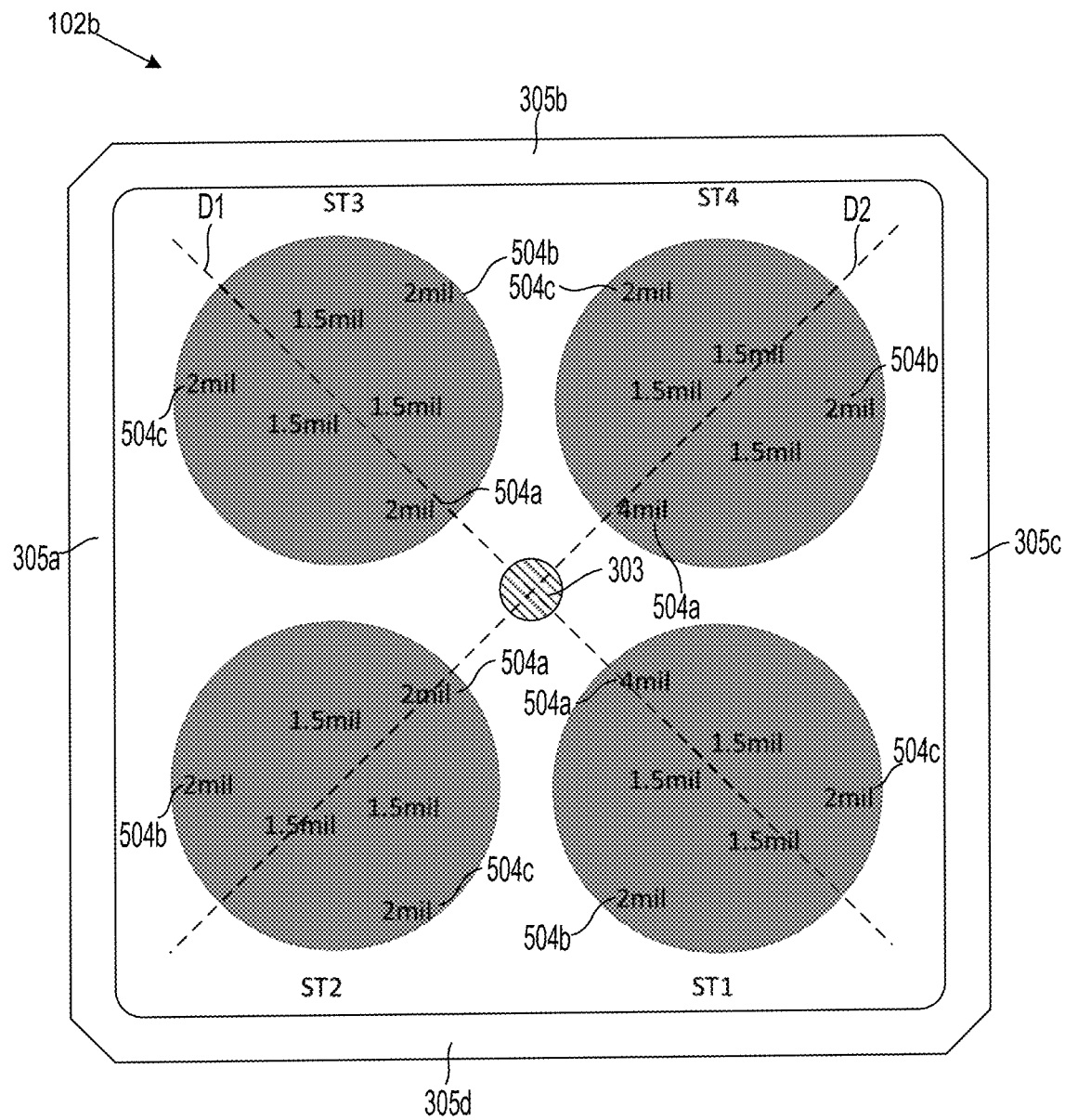
FIG. 14B is a diagram illustrating an increase in heights of wafers at locations closer to a spindle for multiple stations, in accordance with some embodiments described in the present disclosure.

FIG. 14B is a diagram of an embodiment of the lower chamber portion 102b to illustrate a change in height of the MCA support 504a in each of the stations 1 and 4. For example, the MCA support 504a of the station 1 is 4 mil in height, which is higher compared to the MCA supports 504b and 504c of the station 1. As another example, the MCA support 504a of the station 4 is 4 mil in height, which is higher compared to the MCA supports 504b and 504c of the station 4.

Figure 15A:
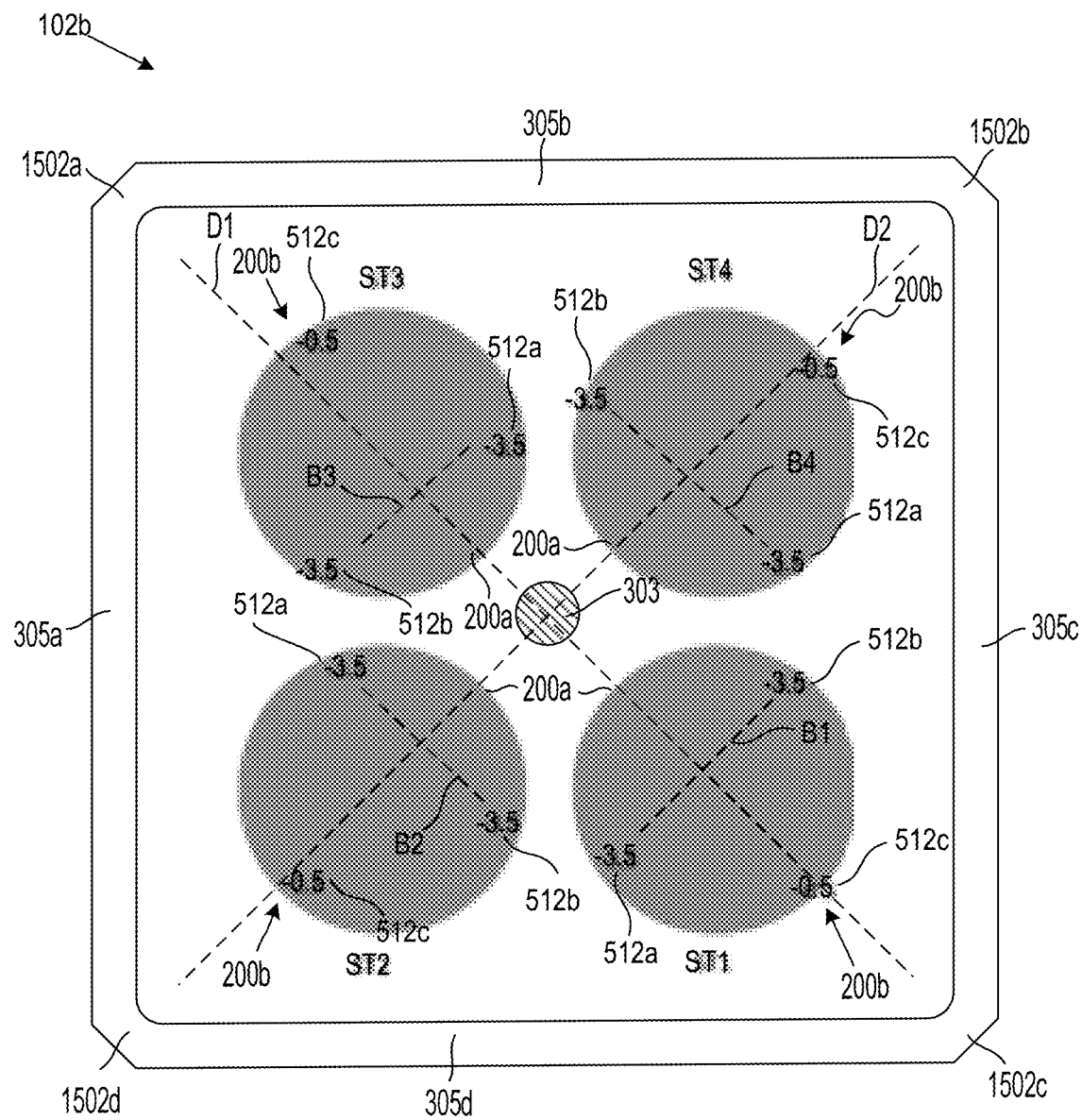
FIG. 15A is a diagram of a lower chamber portion to illustrate an increase in height of a plurality of carrier ring supports to increase a height of a side of the carrier ring within multiple stations, in accordance with some embodiments described in the present disclosure.

FIG. 15A is a diagram of an embodiment of the lower chamber portion 102b to illustrate an increase in height of the carrier ring supports 512a and 512b to increase a height of the side 200a of the carrier ring 200 within the stations 1 thru 4. Height of the carrier ring supports 512a and 512b for each of the stations 1 thru 4 are raised to 3.5 mil compared to height of the carrier ring support 512c of each of the stations 1 thru 4. The increase in height of the carrier ring supports 512a and 512b increase a height of the side 200a of the carrier ring 200 compared to a height of the side 200b of the carrier ring 200.

The diagonal axis D1 bisects a line B1 that connects the carrier ring support 512a of the station ST1 to the carrier ring support 512b of the station ST1. Moreover, the diagonal axis D2 bisects a line B2 that connects the carrier ring support 512a of the station ST2 to the carrier ring support 512b of the station ST2. Also, the diagonal axis D1 bisects a line B3 that connects the carrier ring support 512a of the station ST3 to the carrier ring support 512b of the station ST3. The diagonal axis D2 bisects a line B4 that connects the carrier ring support 512a of the station ST4 to the carrier ring support 512b of the station ST4.

It should be noted that in some embodiments, heights of the carrier ring supports 512a and 512b for each of the stations 1 thru 4 are increased by a different amount than that illustrated in FIG. 11. For example, a height of the carrier ring support 512a of the station 1 is 4 mil instead of 3.5 mil.

As another example, height of the carrier ring support 512*b* of the station 3 is 4.5 mil instead of 3.5 mil.

In some embodiments, a height of the carrier ring support 512*a* is increased by a different amount than a height of the carrier ring support 512*b*. For example, a height of the carrier ring support 512*a* of the station 1 is 4 mil and a height of the carrier ring support 512*a* of the station 1 is 3 mil.

In various embodiments, the carrier ring supports 512*a* and 512*b* of one or more of the stations 1 thru 4 have increased heights compared to the carrier ring support 512*c* of the one or more stations. For example, the carrier ring supports 512*a* and 512*b* of the station 1 are elevated compared to the carrier ring support 512*c* of the station 1 and the carrier ring supports 512*a* and 512*b* of the station 4 have the same height as that of the carrier ring support 512*c* of the station 4.

It should be noted that the carrier ring supports 512*a* and 512*b* of the station ST3 are closer to the spindle 303 compared to a corner 1502*a* formed at a location at which the side wall 305*a* is connected to the side wall 305*b*. Moreover, the carrier ring support 512*c* of the station ST3 is closer to the corner 1502*a* compared to the spindle 303. Similarly, the carrier ring supports 512*a* and 512*b* of the station ST4 are closer to the spindle 303 compared to a corner 1502*b* formed at a location at which the side wall 305*b* is connected to the side wall 305*c*. Moreover, the carrier ring support 512*c* of the station ST4 is closer to the corner 1502*b* compared to the spindle 303. Furthermore, the carrier ring supports 512*a* and 512*b* of the station ST1 are closer to the spindle 303 compared to a corner 1502*c* formed at a location at which the side wall 305*c* is connected to the side wall 305*d*. Moreover, the carrier ring support 512*c* of the station ST1 is closer to the corner 1502*c* compared to the spindle 303. Similarly, the carrier ring supports 512*a* and 512*b* of the station ST2 are closer to the spindle 303 compared to a corner 1502*d* formed at a location at which the side wall 305*d* is connected to the side wall 305*a*. Moreover, the carrier ring support 512*c* of the station ST2 is closer to the corner 1502*d* compared to the spindle 303. The corer 1502*a* and the corner 1502*c* are intersected by the diagonal axis D1 and the corner 1502*b* and the corner 1502*d* are intersected by the diagonal axis D2.

Figure 15B:
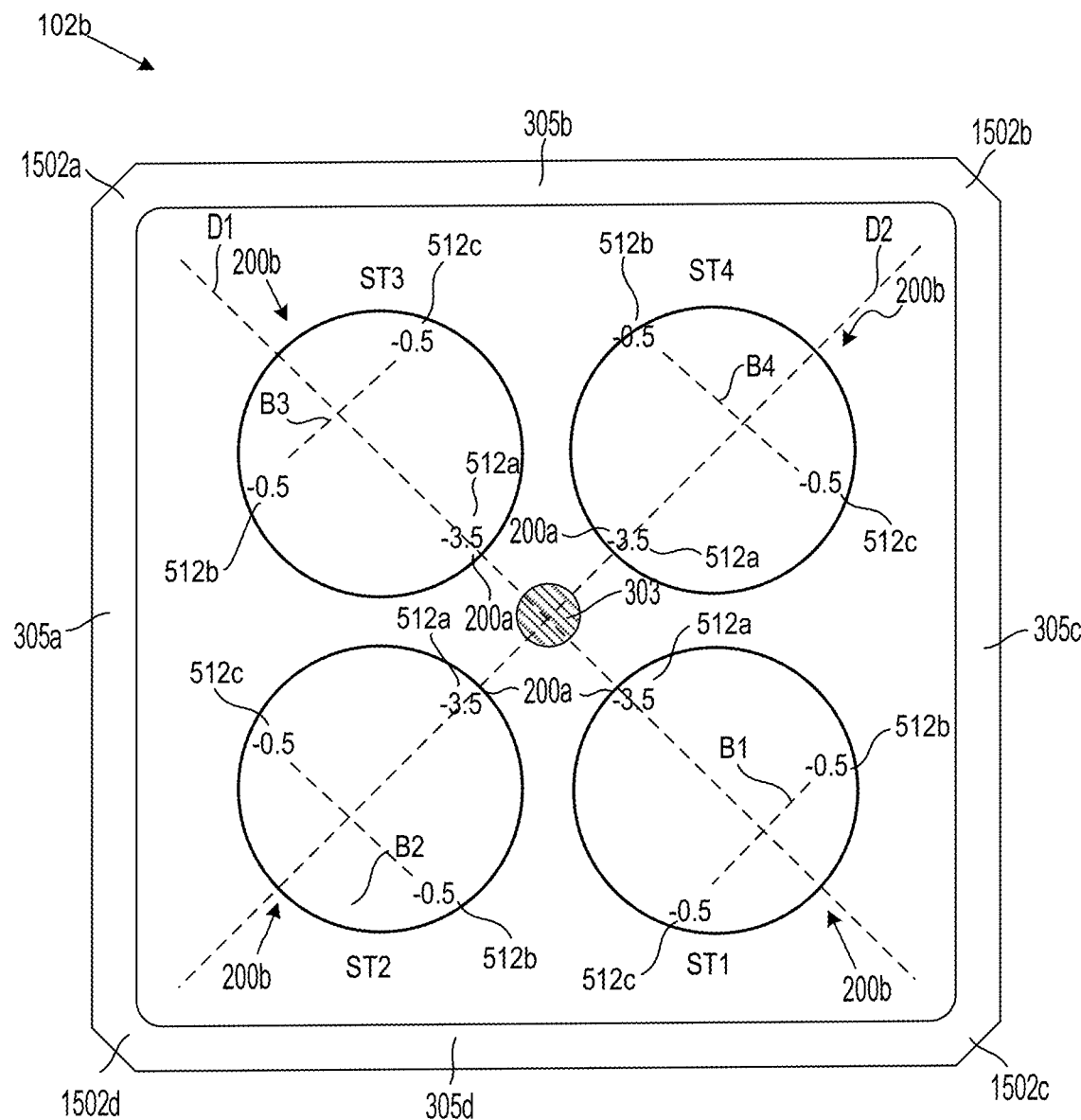
FIG. 15B is a diagram of a lower chamber portion to illustrate an increase in height of a carrier ring support that is located towards the spindle compared to carrier ring supports that are located away from the spindle to raise a height of the wafer closer to the spindle, in accordance with some embodiments described in the present disclosure.

FIG. 15B is a diagram of an embodiment of the lower chamber portion 102*b* to illustrate that the carrier ring support 512*a* for each of the stations ST1 thru ST4 is located closer to the spindle 303 compared to the carrier ring supports 512*b* and 512*c*. The carrier ring support 512*a* of the stations ST2 and ST4 are located on the diagonal axis D2 and the carrier ring support 512*a* of the stations ST1 and ST3 are located on the diagonal axis D1. Moreover, the carrier ring supports 512*b* and 512*c* of the station ST1 are located on the line B1, and are located closer to the side walls 305*c* and 305*d* and the corner 1502*c* compared to the carrier ring support 512*a* of the station ST1. Similarly, the carrier ring supports 512*b* and 512*c* of the station ST2 are located on the line B2, and are located closer to the side walls 305*a* and 305*d* and the corner 1502*d* compared to the carrier ring support 512*a* of the station ST2. Also, the carrier ring supports 512*b* and 512*c* of the station ST3 are located on the line B3, and are located closer to the side walls 305*a* and 305*b* and the corner 1502*a* compared to the carrier ring support 512*a* of the station ST3. Similarly, the carrier ring supports 512*b* and 512*c* of the station ST4 are located on the line B4, and are located closer to the side walls 305*b* and 305*c* and the corner 1502*b* compared to the carrier ring support 512*a* of the station ST4. The carrier ring support 512*a* of each of the stations ST1 thru ST4 are raised compared to the carrier ring supports 512*b* and 512*c* of the station to increase a height of the wafer closer to the spindle.

In some embodiments, the carrier ring support 512*a* of one or more of the stations ST1 thru ST4 is raised and the carrier ring support 512*a* of other ones of the stations ST1 thru ST4 is not raised. For example, the carrier ring support 512*a* of each of the stations ST1 and ST3 is raised compared to carrier ring supports 512*b* and 512*c* of the stations ST1 and ST3, and the carrier ring support 512*a* of each of the stations ST2 and ST4 is not raised compared to carrier ring supports 512*b* and 512*c* of the stations ST2 and ST4.

In several embodiments, the carrier ring support 512*a* is raised by another amount than that illustrate in FIG. 15B. For example, the carrier ring support 512*a* is raised by 4 mil instead of 3.5 mil. As another example, the carrier ring support 512*a* is raised by 3 mil or 4.5 mil instead of 3.5 mil.

Figure 15C:
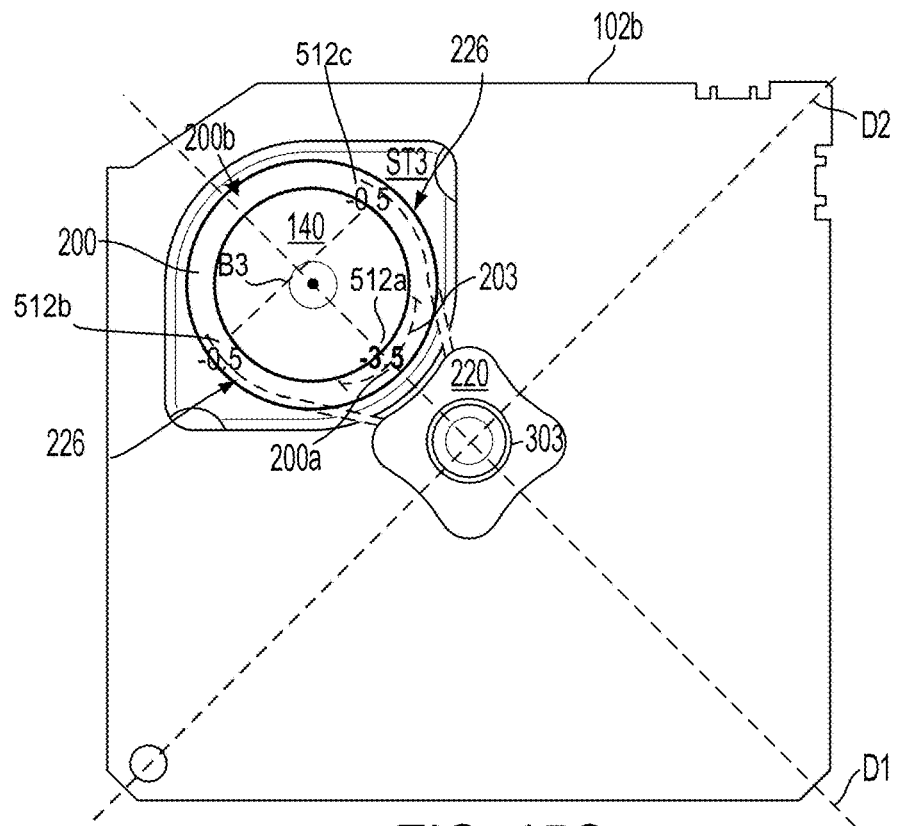
FIG. 15C is a diagram of a lower chamber portion to illustrate an increase in height of a plurality of carrier ring supports to increase a height of a side of the carrier ring, in accordance with some embodiments described in the present disclosure.

FIG. 15C is a top view of an embodiment of the lower chamber portion 102 to illustrate an increase in height of the carrier ring support 512*a* of the station ST3 with respect to heights of the carrier ring supports 512*b* and 512*c* of the station ST3 to increase a height of the wafer at the end 200*a* of the carrier ring 200 compared to a height of the wafer at the end 200*b* of the carrier ring 200. The line B3 along which the carrier ring supports 512*b* and 512*c* are aligned is bisected by the diagonal axis D1 at a perpendicular angle or a substantially perpendicular angle, e.g., an angle between 85 degrees and 95 degrees, etc. The diagonal axis D1 intersects, e.g., bisects, etc., the side 203.

Figure 15D:
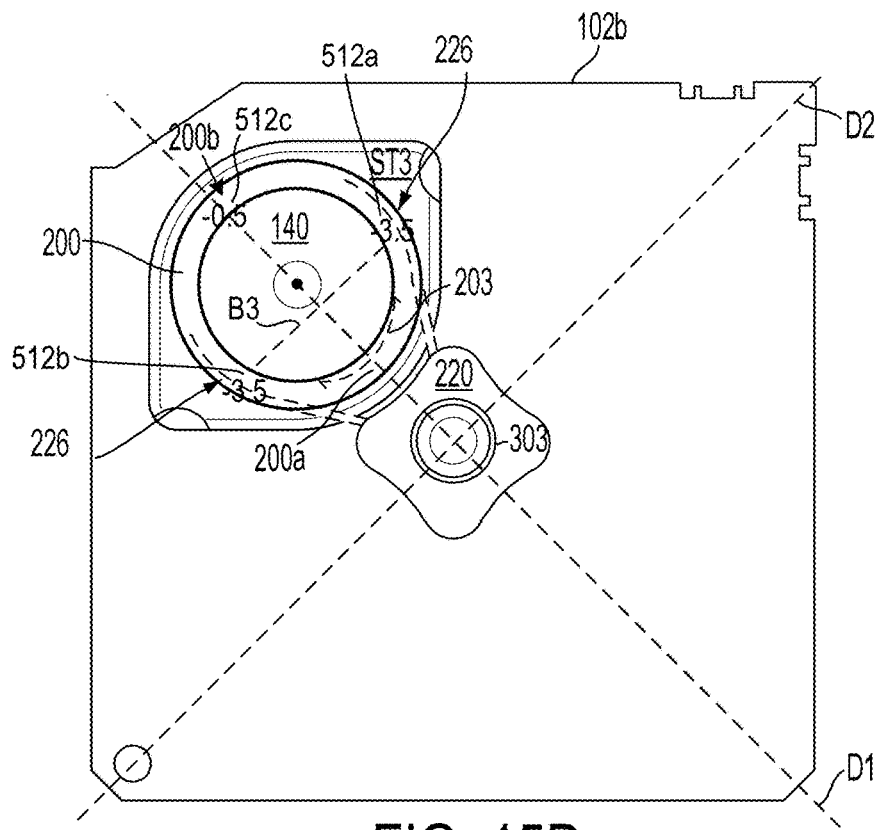
FIG. 15D is a diagram of a lower chamber portion to illustrate an increase in height of a carrier ring support that is located towards the spindle compared to carrier ring supports that are located away from the spindle to raise a height of the wafer closer to the spindle, in accordance with some embodiments described in the present disclosure.

FIG. 15D is a top view of an embodiment of the lower chamber portion 102 to illustrate an increase in height of the carrier ring supports 512*a* and 512*b* of the station ST3 with respect to a height of the carrier ring support 512*c* of the station ST3 to increase a height of the wafer at the end 200*a* of the carrier ring 200 compared to a height of the wafer at the end 200*b* of the carrier ring 200. The line B3 along which the carrier ring supports 512*a* and 512*b* are aligned is bisected by the diagonal axis D1 at a perpendicular angle or a substantially perpendicular angle, e.g., an angle between 85 degrees and 95 degrees, etc. The diagonal axis D1 intersects, e.g., bisects, etc., the side 203.

Figure 16A:
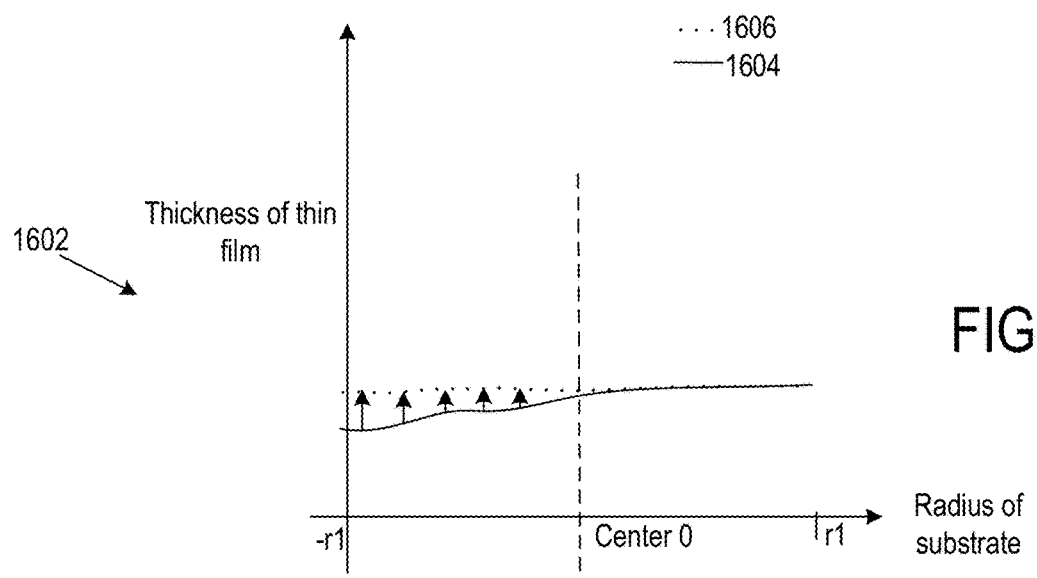
FIG. 16A is a graph to illustrate an increase in uniformity of deposition of a thin film on the wafer by tilting the wafer at one end of the wafer, in accordance with some embodiments described in the present disclosure.

FIG. 16A is an embodiment of a graph 1602 to illustrate an increase in uniformity of deposition of a thin film on the wafer 101 by tilting the wafer 101 at one end of the wafer 101. The graph 1602 plots thickness of a thin film deposited on the wafer 101 versus a radius r1 of the wafer 101. A solid curve 1604 represents a thickness of the thin film across the wafer 101 when the wafer 101 is not tilted. As shown, there is a lower amount of deposition on a left side, e.g., a distance from 0 to −r1, etc., of the wafer 101 compared to a right side, e.g., a distance from 0 to r1, etc., of the wafer 101. After the wafer 101 is tilted, as illustrated by a dotted curve 1606, there is an increase in an amount of deposition on the left side to increase an uniformity of thickness of a film deposited on the wafer 101 across the top surface of the wafer 101.

Figure 16B:
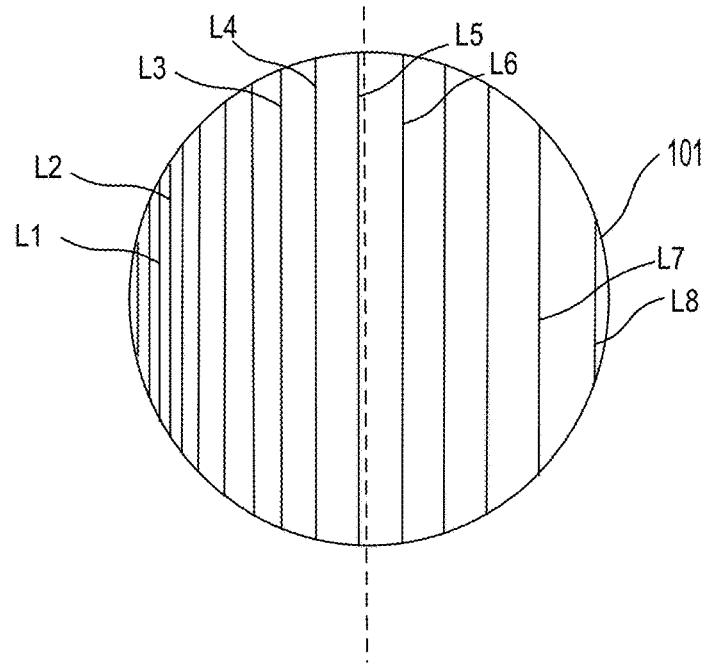
FIG. 16B is an embodiment of the wafer to illustrate an increase in an amount of deposition of a thin film on a top surface of the wafer when the wafer is tilted, in accordance with some embodiments described in the present disclosure.

FIG. 16B is an embodiment of the wafer 101 to illustrate a change in an amount of deposition of a thin film on the top surface of the wafer 101 when the wafer 101 is tilted. As shown, a distance between two adjacent lines represents an amount of deposition on an area of the top surface of the wafer 101. A distance between lines L1 and L2 is less than a distance between two lines L3 and L4. The distance between the lines L3 and L4 is less than a distance between lines L5 and L6. Also, the distance between the lines L5 and L6 is less than a distance between lines L7 and L8. The lower amount of distance between the lines L1 and L2 represents a higher amount of deposition of a thin film on a region between the lines L1 and L2 compared to a region between the lines L3 and L4. Similarly, the lower amount of distance between the lines L3 and L4 represents a higher amount of deposition of a thin film on a region between the lines L3 and L4 compared to a region between the lines L5 and L6. Also, the lower amount of distance between the lines L5 and L6 represents a higher amount of deposition of a thin film on a region between the lines L5 and L6 compared to a region between the lines L7 and L8. When the wafer 101 is tilted, there is a decrease in an amount of deposition across the wafer 101 from a left edge of the wafer 101 to a right edge of the wafer 101 to increase uniformity of thickness of a thin film deposited on the wafer 101.

In various embodiments, any of the above-described embodiments for tilting the wafer 101 are used in combination with a temperature modification method to increase uniformity of a thin film being deposited on the wafer 101. For example, in addition to tilting the wafer 101, a temperature of the pedestal 140 is controlled by using one or more thermocouples and one or more heater elements to reduce a thermal gradient across a surface of the pedestal 140. The reduction of the thermal gradient improves uniformity in thickness of the thin film across the wafer 101.

In some embodiments, any of the above-described embodiments for tilting the wafer 101 are used in combination with a plasma density modification method to increase uniformity of a thin film being deposited on the wafer 101. Due to chamber asymmetries in geometry, e.g., distance from the pedestal 140 to closest surface of the showerhead, etc., could lead to differences in plasma densities, which could then lead to different plasma heating of the top surface of the wafer 101. In addition to tilting the wafer 101, plasma density is measured near the top surface of the wafer 101 and is modified, e.g., by gas flow, etc., to achieve a uniform plasma density across the top surface of the wafer 101 to further achieve uniformity in thickness in a thin film being deposited across the top surface of the wafer 101.

In several embodiments, any of the above-described embodiments for tilting the wafer 101 are used in combination with a plasma impedance modification method to increase uniformity of a thin film being deposited on the wafer 101. Plasma impedance differences that result in higher plasma or ion density result in a thinner film towards the spindle. A couple of factors that can contribute to impedance differences include wafer to showerhead or showerhead to pedestal gap. Along with these specific gaps, wafer to pedestal gap and or wafer to carrier ring gap changes causes further impedance differences across a surface of the wafer 101. In addition to tilting the wafer 101, plasma impedance is measured across a top surface of the wafer 101 and is modified to achieve a uniform plasma density across the top surface of the wafer 101 to further achieve uniformity in thickness in a thin film being deposited across the top surface of the wafer 101.

In various embodiments, one or more of the temperature modification method, the plasma density modification method, and the plasma impedance modification method is used in conjunction with tilting the wafer 101 to achieve uniformity in thickness in a thin film being deposited across the top surface of the wafer 101.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a deposition chamber or module, a spin-rinse chamber or module, a metal plating chamber or module, a clean chamber or module, a physical vapor deposition (PVD) chamber or module, a chemical vapor deposition (CVD) chamber or module, an ALD chamber or module, an ion implantation chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A processing chamber used for depositing films on substrates using plasma, comprising:
   a spindle disposed in the processing chamber;
   a pedestal disposed in the processing chamber, such that a side of the pedestal is adjacent to the spindle, the pedestal including a top surface for supporting a substrate when present, wherein the pedestal has a first annular surface and a second annular surface, wherein the first annular surface is a level below and peripheral to the top surface, wherein the second annular surface is a level below and peripheral to the first annular surface;
   a plurality of minimum contact angle (MCA) supports fitted into a plurality of slots that are partially formed into the top surface of the pedestal for supporting the substrate when present, wherein the plurality of MCA supports include a first set of MCA supports that are positioned at vertices of a first triangular region on the top surface of the pedestal and a second set of MCA supports that are positioned at vertices of a second triangular region on the top surface of the pedestal, wherein the second triangular region is encompassed within the first triangular region, wherein one of the MCA supports of the first set is positioned closer to the spindle than other ones of the MCA supports of the first set, and the one of the MCA supports of the first set has a greater height compared to the other ones of the MCA supports of the first set, wherein the one of the MCA supports of the first set is located at one of the vertices of the first triangular region; and
   a plurality of ring supports located along a periphery of the pedestal, wherein one of the plurality of ring supports is positioned closer to the spindle than other ones of the plurality of ring supports, and the one of the plurality of ring supports being positioned at an elevated position relative to the other ones of the plurality of ring supports,
   wherein the greater height of the one of the MCA supports of the first set and the elevated position of the one of the plurality of ring supports are configured to raise a side of the substrate when present at an angle over the top surface of the pedestal, wherein the side of the substrate that is raised is adjacent to the spindle, wherein the plurality of ring supports are disposed around the plurality of MCA supports and are disposed on top of the second annular surface of the pedestal.

2. The processing chamber of claim 1, wherein the greater height of the one of the MCA supports of the first set reduces deflection of the substrate when present.

3. The processing chamber of claim 1, wherein the elevated position of the one of the plurality of ring supports reduces an amount of deposition on a backside of the substrate when present.

4. The processing chamber of claim 1, wherein the plurality of ring supports have a plurality of recesses, the processing chamber further comprising a carrier ring disposed over the pedestal at the periphery of the pedestal, wherein the carrier ring has an underside, wherein a plurality of protrusions of the carrier ring extend from the underside, wherein the plurality of protrusions extend into the plurality of recesses to support the carrier ring on the plurality of ring supports.

5. The processing chamber of claim 1, wherein the greater height of the one of the MCA supports of the first set and the elevated position of the one of the plurality of ring supports are configured to raise the side of the substrate when present to reduce an amount of deposition on a backside of the substrate when present.

6. The processing chamber of claim 1, wherein the plurality of ring supports are placed at vertices of an equilateral triangle.

7. The processing chamber of claim 1, wherein the first triangular region is an equilateral triangle on the top surface of the pedestal.

8. The processing chamber of claim 1, further comprising a spacer placed below the one of the plurality of ring supports to raise the elevated position of the one of the plurality of ring supports relative to the other ones of the plurality of ring supports.

9. The processing chamber of claim 1, wherein the one of the plurality of ring supports is configured to be moved by an actuator to be positioned at the elevated position relative to the other ones of the plurality of ring supports.

10. The processing chamber of claim 1, wherein the one of the MCA supports of the first set is configured to be moved by an actuator to achieve the greater height relative to the other ones of the MCA supports of the first set.

11. The processing chamber of claim 1, further comprising:
a plurality of lift pins that are in contact with the substrate when present;
an actuator configured to control the plurality of lift pins to raise the substrate when present and to lower the substrate when present, wherein the substrate is raised to remove the substrate from the processing chamber, wherein the pedestal has a bottom surface that is configured to receive the plurality of lift pins.

12. The processing chamber of claim 1, wherein each of the plurality of MCA supports is fabricated from a stone.

13. The processing chamber of claim 1, wherein each of the plurality of MCA supports is supported by a respective one of a plurality of bottom surfaces of the plurality of slots.

14. The processing chamber of claim 1, wherein each of the plurality of slots that are partially formed into the top surface of the pedestal has a respective bottom surface.

15. The processing chamber of claim 14, further comprising a heating element that is located between the bottom surface of one of the plurality of slots and the one of the MCA supports of the first set.

16. The processing chamber of claim 14, further comprising:
a plurality of lift pins that extend into the pedestal from a bottom surface of the pedestal, wherein the plurality of lift pins are disposed around the MCA supports of the second set.

17. The processing chamber of claim 16, wherein the plurality of ring supports are disposed around the plurality of lift pins.

18. The processing chamber of claim 16, wherein the plurality of lift pins are disposed at a plurality of vertices of a third triangular region.

* * * * *